US006856923B2

(12) United States Patent
Jung

(10) Patent No.: US 6,856,923 B2
(45) Date of Patent: Feb. 15, 2005

(54) METHOD FOR ANALYZING MUSIC USING SOUNDS INSTRUMENTS

(75) Inventor: Doill Jung, Seoul (KR)

(73) Assignee: AMUSETEC Co., Ltd., Seoul (KR)

( * ) Notice: Subject to any disclaimer, the term of this patent is extended or adjusted under 35 U.S.C. 154(b) by 27 days.

(21) Appl. No.: 10/433,051

(22) PCT Filed: Dec. 3, 2001

(86) PCT No.: PCT/KR01/02081

§ 371 (c)(1), (2), (4) Date: May 30, 2003

(87) PCT Pub. No.: WO02/47064

PCT Pub. Date: Jun. 13, 2002

(65) Prior Publication Data

US 2004/0044487 A1 Mar. 4, 2004

(30) Foreign Application Priority Data

Dec. 5, 2000 (KR) ....................................... 2000-73452

(51) Int. Cl.[7] .......................... G06F 19/00; G01R 23/00

(52) U.S. Cl. ............................ 702/71; 84/603; 84/616; 84/626

(58) Field of Search ............................. 702/66, 71, 75, 702/112, 124, 193; 84/454, 462, 464, 465, 603, 608, 609, 616, 622, 626

(56) References Cited

U.S. PATENT DOCUMENTS 4,479,416 A * 10/1984 Clague ........................ 84/462
4,681,007 A * 7/1987 Nikaido et al. ............... 84/626
5,276,629 A 1/1994 Reynolds ..................... 702/71
5,942,709 A * 8/1999 Szalay ......................... 84/616
5,986,198 A * 11/1999 Gibson et al. ................ 84/603

FOREIGN PATENT DOCUMENTS

KR 2001-0016009 A 3/2001

* cited by examiner

*Primary Examiner*—John Barlow
*Assistant Examiner*—John Le
(74) *Attorney, Agent, or Firm*—Harness, Dickey & Pierce, P.L.C.

(57) ABSTRACT

A method for analyzing digital-sounds using sound-information of instruments and/or score-information is provided. Particularly, sound-information of instruments which were used or which are being used to generate input digital-sounds is used. Alternatively, in addition to the sound-information, score-information which were used or which are being used to generate the input digital-sounds is also used. According to the method, sound-information including pitches and strengths of notes performed on instruments used to generate the input digital-sounds is stored in advance so that monophonic or polyphonic pitches performed on the instruments can be easily analyzed. Since the sound-information of instruments and the score-information are used together, the input digital-sounds can be accurately analyzed and output as quantitative data.

29 Claims, 40 Drawing Sheets

ADAGIO CANTABILE

FIRST TWO MEASURES OF SECOND MOVEMENT
IN BEETHOVEN'S PIANO SONATA NO. 8

FIG.9A

| | | | | | | | | | | | | | |
|---|---|---|---|---|---|---|---|---|---|---|---|---|---|
| PITCH | A0 | B0♭ | B0 | C1 | D1♭ | ··· | C4 | ··· | A7 | B7♭ | B7 | C8 |

FIG.9B

| | | | | | | |
|---|---|---|---|---|---|---|
| NOTE STRENGTH | $-\infty$ | ··· | -7dB | ··· | 0 |

FIG.9C

| | | | | | | | | |
|---|---|---|---|---|---|---|---|---|
| PEDAL TABLE | 000 | 001 | 010 | 100 | 101 | 110 | 011 | 111 |

METHOD FOR ANALYZING MUSIC USING SOUNDS INSTRUMENTS

This application is the national phase under 35 U.S.C. § 371 of PCT International Application No. PCT/KR01/02081 which has an International Filing Date of Dec. 3, 2001, which designated the United States of America.

TECHNICAL FIELD

The present invention relates to a method for analyzing digital-sound-signals, and more particularly to a method for analyzing digital-sound-signals by comparing frequency-components of input digital-sound-signals with frequency-components of performing-instruments'-sounds.

BACKGROUND ART

Since personal computers started to be spread in 1980's, technology, performance and environment of computers have been rapidly developed. In 1990's, the Internet was rapidly applied to various fields of companies and personal lives. Therefore, computers are going to be very important in every field throughout the world in the 21st century. One of the computer music applications is musical instrument digital interface (MIDI). MIDI is a representative computer music technique used by musicians to synthesize and/or store musical sounds of instruments or voices. At present, MIDI is a technique mainly used by popular music composers or players.

For example, composers can easily compose music using computers connected to electronic MIDI instruments, and computers or synthesizers can easily reproduce the composed MIDI music. In addition, sounds produced using MIDI equipments can be mixed with vocals in studios to be recreated as a popular song having support of the public.

The MIDI technique has been developed in combination with popular music and has been entered to musical education field. In other words, MIDI uses only simple musical-information like instrument-types, notes, notes'-strength, onset and offset of notes regardless of the actual sounds of musical performance so that MIDI data can be easily exchanged between MIDI instruments and computers. Accordingly, the MIDI data generated by electronic-MIDI-pianos can be utilized in musical education using computers, which are connected to those electronic-MIDI-pianos. Therefore, many companies including Yamaha in Japan develop musical education software using MIDI.

However, the MIDI technique does not satisfy the desires of most classical musicians treasuring sounds of acoustic instruments and feelings arising when playing acoustic instruments. Because most of the classical musicians do not like the sounds and feelings of electronic instruments, they study music through traditional methods and learn how to play acoustic instruments. Accordingly, music teachers and students teach and learn classical music in academies of music or schools of music, and there is no other way for students but to fully depend on music teachers. In this situation, it is desired to apply computer technology and digital signal processing technology to the field of classical music education so that the music performed on acoustic instruments can be analyzed and the result of analysis can be expressed by quantitative performance information.

For this, digital sound analysis technology, which digital sounds are converted from the performing sounds on acoustic instruments, has been developed using computers in various viewpoints.

For example, the method of using score information to extract MIDI data from recorded digital sounds is disclosed in a master's thesis entitled "Extracting Expressive Performance Information from Recorded Music," written by Eric D. Scheirer. This thesis relates to extracting of the notes'-strength, onset timing, offset timing of each note and converting the extracted information into MIDI data. However, referring to the results of experiments described in the thesis, onset timings were accurately extracted from recorded digital sounds to some extent, but extraction of offset timings and notes'-strength of notes were inaccurate.

Meanwhile, several small companies in the world have put initial products that can analyze simple digital sounds using a music recognition technique on the market. According to the official alt.music.midi newsgroup FAQ (frequently asked questions), which is on the Internet page http://home.sc.rr.com/cosmogony/ammfaq.html, there are some products to convert wave files into MIDI data or score data by analyzing the digital sounds in wave files. The products include Akoff Music Composer, Sound2MIDI, Gama, WIDI, Digital Ear, WAV2MID, Polyaxe Driver, WAV2MIDI, IntelliScore, PFS-System, Hanauta Musician, Audio to MIDI, AmazingMIDI, Capella-Audio, AutoScore, and most recently published WaveGoodbye.

Some of these products are advertised as being able to analyze polyphonic-sounds. However, it was found that they could not analyze polyphonic-sounds as a result of experiments. For this reason, the FAQ document describes that the reproduced MIDI sounds cannot be heard just like the original sounds after the sounds have been converted into MIDI format. Moreover, the FAQ document plainly states that all software published at present for converting wave files into MIDI files are of no worth.

The following description concerns the result of the experiment on AmazingMIDI by Araki Software to find how it analyzes polyphonic-sounds in a wave file.

FIG. 1 is a piece of musical score used in the experiment and shows first two measures of the second movement in Beethoven's Piano Sonata No. 8. In FIG. 2, the score is divided in units of monophonic notes for convenience of analysis, and the note names are assigned to the individual notes. FIG. 3 shows a parameter setting window on which a user sets parameters for converting a wave file into a MIDI file in AmazingMIDI. FIG. 4 is a window showing the converted MIDI data obtained when all parameter control bars are fixed at the right-most ends of control sections. FIG. 5 shows the expected original notes based on the score of FIG. 2 using black bars on the MIDI window of FIG. 4. FIG. 6 is another MIDI window showing the converted MIDI data obtained when all the parameter control bars are fixed at the left-most ends of the control sections. FIG. 7 shows the expected original notes using black bars on the MIDI window of FIG. 6, like FIG. 5.

Referring to FIGS. 1 and 2, three notes C4, A3♭, and A2♭ initially start. Then, in a state where piano keys corresponding to the notes C4 and A2♭ are pressed, keys corresponding to notes E3♭, A3♭, and E3♭ are sequentially pressed. Next, a note B3♭ follows the note C4, and simultaneously, notes D3♭ and G3 follows the notes A2♭ and E3♭, respectively. Then, in a sate where keys corresponding to the notes B3♭ and D3♭ are pressed, keys corresponding to notes E3♭, G3, and E3♭ are sequentially pressed. Accordingly, when this wave file based on the score is converted to MIDI data, MIDI data must be configured as expressed by black bars shown in FIG. 5. However, in the real experiment, MIDI data was configured as shown in FIG. 4.

Referring to FIG. 3, AmazingMIDI allows a user to set various parameters for converting wave files into MIDI files.

Configuration of the MIDI data varied with the set values of these parameters very much. When the values of Minimum Analysis, Minimum Relative, and Minimum Note were set to the right-most values on the parameter input window of FIG. 3, MIDI data resulting from conversion was obtained as shown in FIG. 4. When these values were set to the left-most values, MIDI data resulting from conversion was obtained as shown in FIG. 6. When FIG. 4 is compared with FIG. 6, it can be seen that there is a lot of difference between them. In other words, only frequencies having large magnitudes in a frequency domain were recognized and expressed in the form of MIDI in FIG. 4, but frequencies having small magnitudes were recognized and expressed in the form of MIDI in FIG. 6. Accordingly, MIDI data shown in FIG. 6 basically contains MIDI data of FIG. 4.

When compared with FIG. 5, FIG. 4 shows that the notes A2♭, E3♭, G3, and D3♭ were not recognized at all, and recognition of the notes C4, A3♭, and B3♭ was very different from actual performance based on the score of FIG. 2. In detail, in the case of the note C4, recognized length is only initial 25% of original length. In the case of the note B3♭, recognized length is less than 20% of original length. In the case of the note A3♭, recognized length is only 35% of original length. Moreover, many notes that were not performed were recognized. A note E4♭ was recognized with loud notes'-strength, and unperformed notes A4♭, G4, B4♭, D5, and F5 were wrongly recognized.

When compared with FIG. 7, FIG. 6 shows that although the notes A2♭, E3♭, G3, D3♭, C4, A3♭, and B3♭ that were actually performed were all recognized, recognized notes were very different from the performed notes. In other words, the actual sounds of the notes C4 and A2♭ were continued since the keys were maintained pressed, but the notes C4 and A2♭ were recognized as being stopped at least one time. In the case of the notes A3♭ and E3♭, recognized onset timings and note lengths were very different from actually performed ones. In FIGS. 6 and 7, many gray bars show in addition to black bars. The gray bars indicate notes that were wrongly recognized although they were not actually performed. These wrongly recognized gray bars are more than correctly recognized bars. Although the results of experiments on programs other than AmazingMIDI program will not be described in this specification, it was proved that the results of experiments on all published programs for recognizing music were similar to the result of the experiment on AmazingMIDI program and were not satisfactory.

Although techniques of analyzing music performed on acoustic instruments using computer technology and digital signal processing technology have been developed in various viewpoints, satisfactory results have never been obtained.

DISCLOSURE OF THE INVENTION

Accordingly, the present invention aims at providing a method for analyzing music using sound-information previously stored with respect to the instruments used in performance so that the more accurate result of analyzing the performance can be obtained and the result can be extracted in the form of quantitative data.

In other words, it is a first object of the present invention to provide a method for analyzing music by comparing components contained in digital-sounds with components contained sound-information of musical instruments and analyzing the components so that polyphonic pitches as well as monophonic pitches can be accurately analyzed.

It is a second object of the present invention to provide a method for analyzing music using sound-information of musical instruments and score-information of the music so that the accurate result of analysis can be obtained and time for analyzing music can be reduced.

To achieve the first object of the present invention, there is provided a method for analyzing music using sound-information of musical instruments. The method includes the steps of (a) generating and storing sound-information of different musical instruments; (b) selecting the sound-information of a particular instrument to be actually played from among the stored sound-information of different musical instruments; (c) receiving digital-sound-signals; (d) decomposing the digital-sound-signals into frequency-components in units of frames; (e) comparing the frequency-components of the digital-sound-signals with the frequency-components of the selected sound-information, and analyzing the frequency-components of the digital-sound-signals to detect monophonic-pitches-information from the digital-sound-signals; and (f) outputting the detected monophonic-pitches-information.

To achieve the second object of the present invention, there is provided a method for analyzing music using sound-information of musical instruments and score-information. The method includes the steps of (a) generating and storing sound-information of different musical instruments; (b) generating and storing score-information of a score to be performed; (c) selecting the sound-information of a particular instrument to be actually played and score-information of a score to be actually performed from among the stored sound-information of different musical instruments and the stored score-information; (d) receiving digital-sound-signals; (e) decomposing the digital-sound-signals into frequency-components in units of frames; (f) comparing the frequency-components of the digital-sound-signals with the frequency-components of the selected sound-information and the selected score-information, and analyzing the frequency-components of the digital-sound-signals to detect performance-error-information and monophonic-pitches-information from the digital-sound-signals; and (g) outputting the detected monophonic-pitches-information and/or the detected performance-error-information.

BRIEF DESCRIPTION OF THE DRAWINGS

FIGS. 9A through 9E are diagrams of examples of piano sound-information used to analyze digital sounds.

BEST MODE FOR CARRYING OUT THE INVENTION

Hereinafter, a method for analyzing music according to the present invention will be described in detail with reference to the attached drawings.

Figure 8:
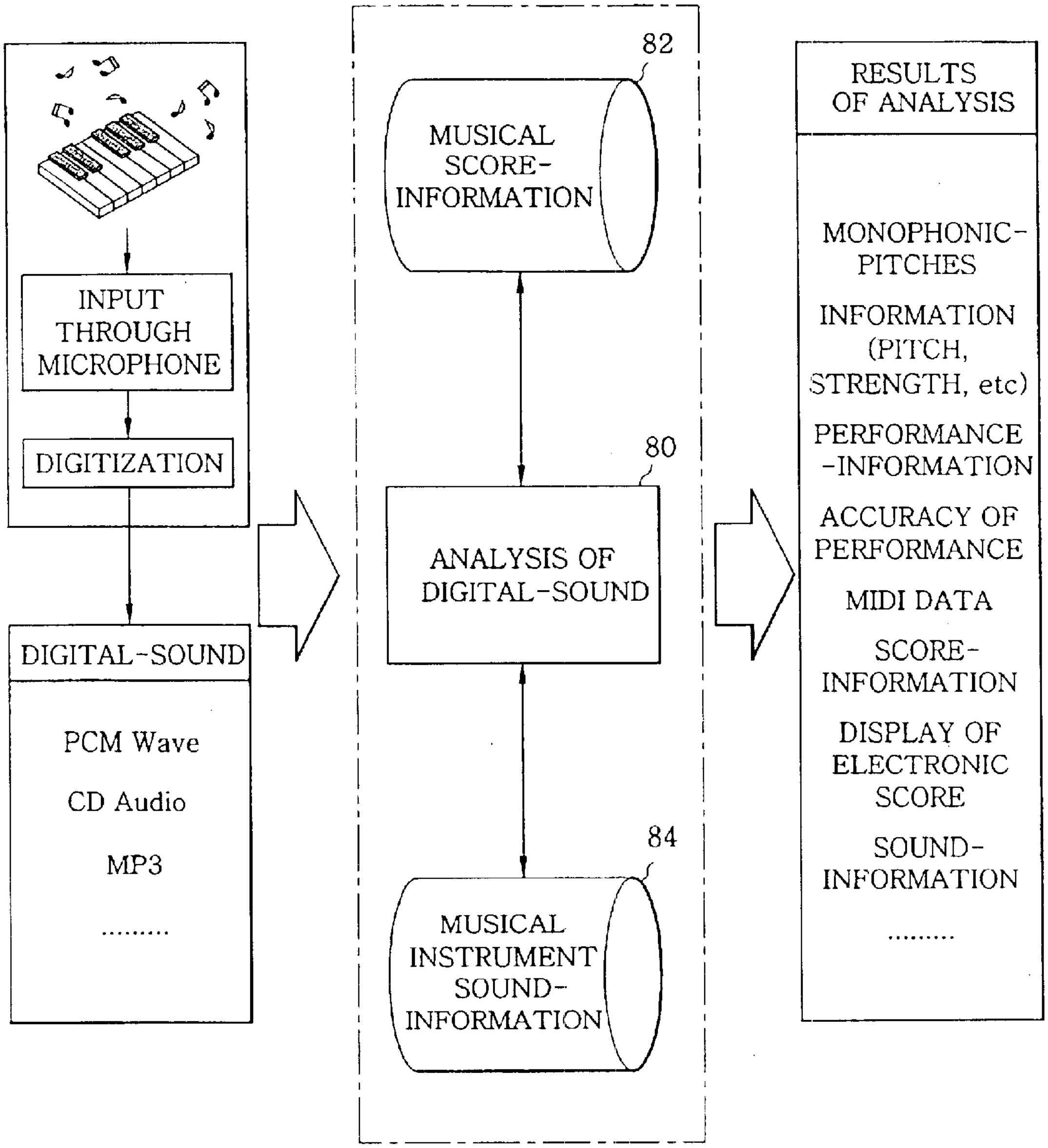
FIG. 8 is a conceptual diagram of a method for analyzing digital-sounds.

FIG. 8 is a conceptual diagram of a method for analyzing digital sounds. Referring to FIG. 8, the input digital-sound signals are analyzed (80) using musical instrument sound-information 84 and input music score-information 82, and as a result, performance-information, accuracy, MIDI data, and so on are detected, and an electronic-score is displayed.

Here, digital-sounds include anything in formats such as PCM waves, CD audios, or MP3 files in which input sounds are digitized and stored so that computers can process the sounds. Music that is performed in real time can be input through a microphone connected to a computer and analyzed while being digitized and stored.

The input score-information 82 includes note-information, note-length-information, speed-information (e.g., ♩=64, and fermata ( )), tempo-information (e.g., 4/4), note-strength-information (e.g., forte, piano, accent (>), and crescendo ( )), detailed performance-information (e.g., staccato, staccatissimo, and pralltriller), and information for discriminating the staves for left hand from the other staves for right hand in the case where both hands are used for performing music on, for example, piano. In addition, in the case where at least two instruments are used, information about the staves for each instrument is included. In other words, all information on a score which people applies to perform music on musical-instruments can be used as score-information. Since notation is different among composers and ages, detailed notation will not be described in this specification.

The musical-instrument sound-information 84 is previously constructed for each of the instruments used for performance, as shown in FIGS. 9A through 9E, and includes information such as pitch, note strength, and pedal table. This will be further described later with reference to FIGS. 9A through 9E.

As shown in FIG. 8, in the present invention, sound-information or both sound-information and score-information are utilized to analyze input digital-sounds. The present invention can accurately analyze the pitch and strength of each note even if many notes are simultaneously performed as in piano music and can detect performance-information including which notes are performed at what strength from the analyzed information in each time slot.

To analyze input digital-sounds, sound-information of musical-instruments is used because each musical-note has an inherent pitch-frequency and inherent harmonic-frequencies, and pitch-frequencies and harmonic-frequencies are basically used to analyze performance sounds of acoustic-instruments and human-voices.

Different types of instruments usually have different peak-frequency-components (pitch-frequencies and harmonic-frequencies). Accordingly, it is possible to analyze digital-sounds by comparing the peak-frequency-components of the digital-sounds with the peak-frequency-components of different types of instruments that are previously detected and stored as sound-information by the types of instruments.

For example, if sound-information of 88 keys of a piano is previously detected and stored, even if different notes are simultaneously performed on the piano, the sounds of simultaneously performed notes can be compared with combinations of 88 sounds previously stored as sound information.

Therefore, each of the simultaneously performed notes can be accurately analyzed.

FIGS. 9A through 9E are diagrams of examples of piano sound-information used to analyze digital-sounds. FIGS. 9A through 9E show examples of sound-information of 88 keys of a piano made by Young-chang.

FIGS. 9A through 9C show the conditions used for detecting sound-information of the piano. FIG. 9A shows the pitches A0 through C8 of the respective 88 keys. FIG. 9B shows note strength identification information. FIG. 9C shows identification information indicating which pedals are used. Referring to FIG. 9B, the note strengths can be classified into predetermined levels from "−∞" to "0". Referring to FIG. 9C, the case where a pedal is used is expressed by "1", and the case where a pedal is not used is expressed by "0". FIG. 9C shows all cases of use of three pedals of the piano.

Figure 9D:
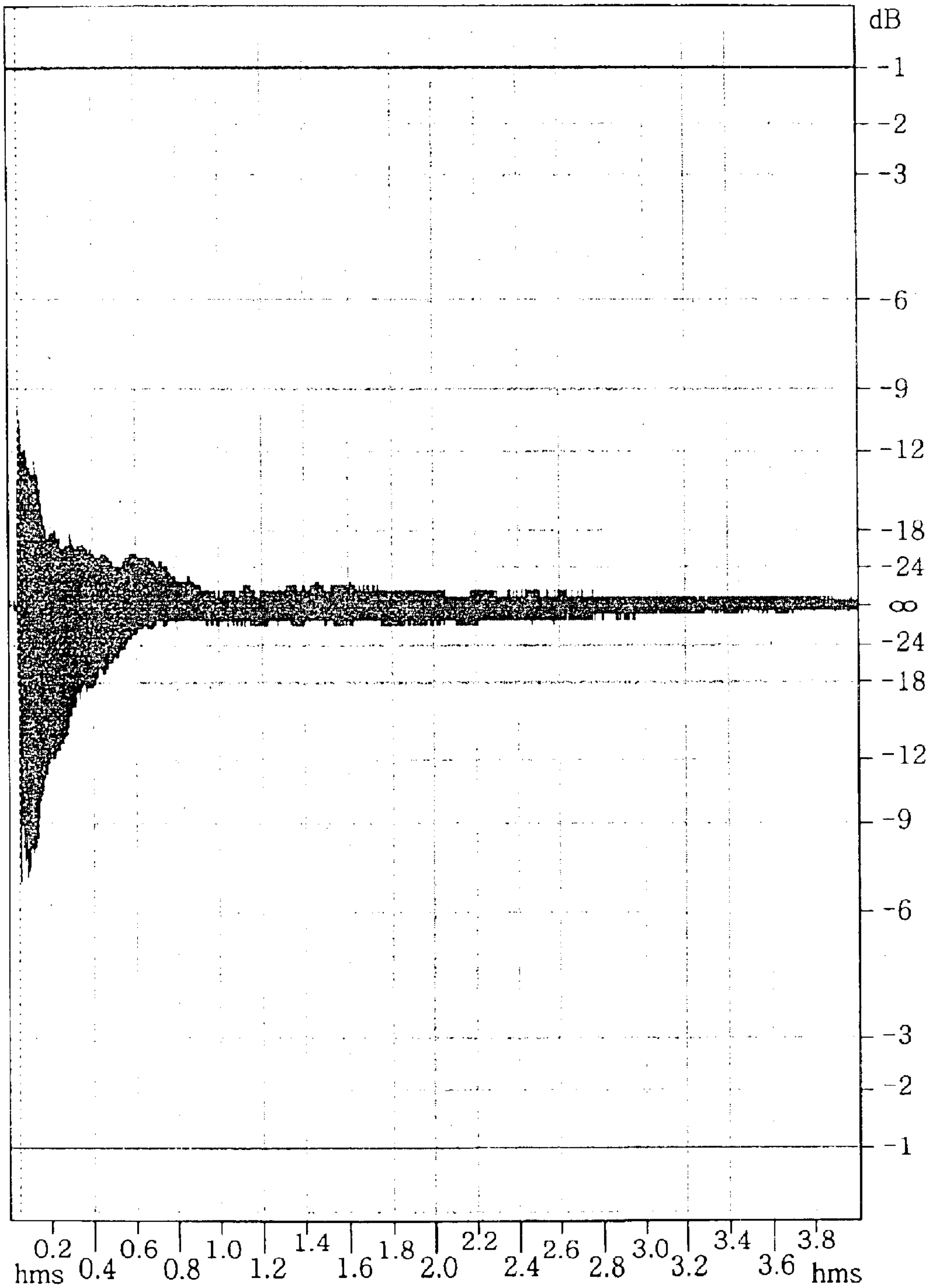
Figure 9E:
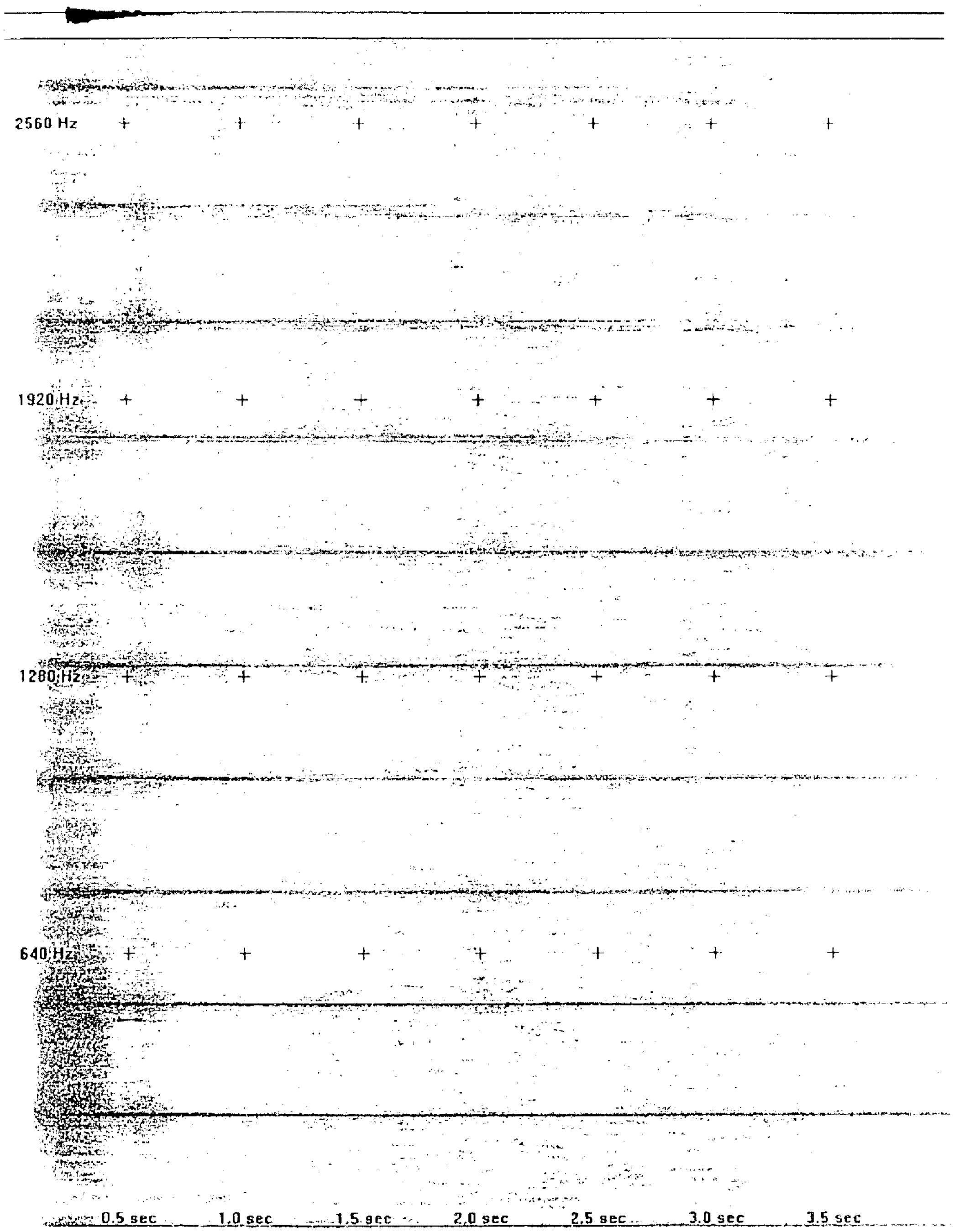

FIGS. 9D and 9E show examples of the actual formats in which the sound-information of the piano is stored. FIGS. 9D and 9E show sound-information with respect to the case where the note is C4, the note strength is −7 dB, and no pedals are used under the conditions of sound-information shown in FIGS. 9A through 9C. Specifically, FIG. 9D shows the sound-information stored in wave format, and FIG. 9E shows the sound-information stored in frequency format, spectrogram. Here, a spectrogram shows the magnitudes of individual frequencies in a temporal domain. The horizontal axis of the spectrogram indicates time information, and the vertical axis thereof indicates frequency information. Referring to a spectrogram as shown in FIG. 9E, frequency-components' magnitudes can be obtained at each time.

In other words, when the sound-information of each musical-instrument is stored in the form of samples of sounds having at least one strength, sounds of each note can be stored as the sound information in wave forms, as shown in FIG. 9D, so that frequency-components can be detected from the waves during analysis of digital-sounds, or the magnitudes of individual frequency-components can be directly stored as the sound-information, as shown in FIG. 9E.

In order to directly express the sound-information of each musical-instrument as the magnitudes of individual frequency-components, frequency analysis methods such as Fourier transform or wavelet transform can be used.

If a string-instrument, for example a violin, is used as a musical-instrument, sound-information can be classified by different strings for the same notes and stored.

Such sound-information of each musical-instrument can be periodically updated according to a user's selection, considering the fact that sound-information of the musical-instrument can vary with the lapse of time or with circumstances such as temperature.

Figure 10:
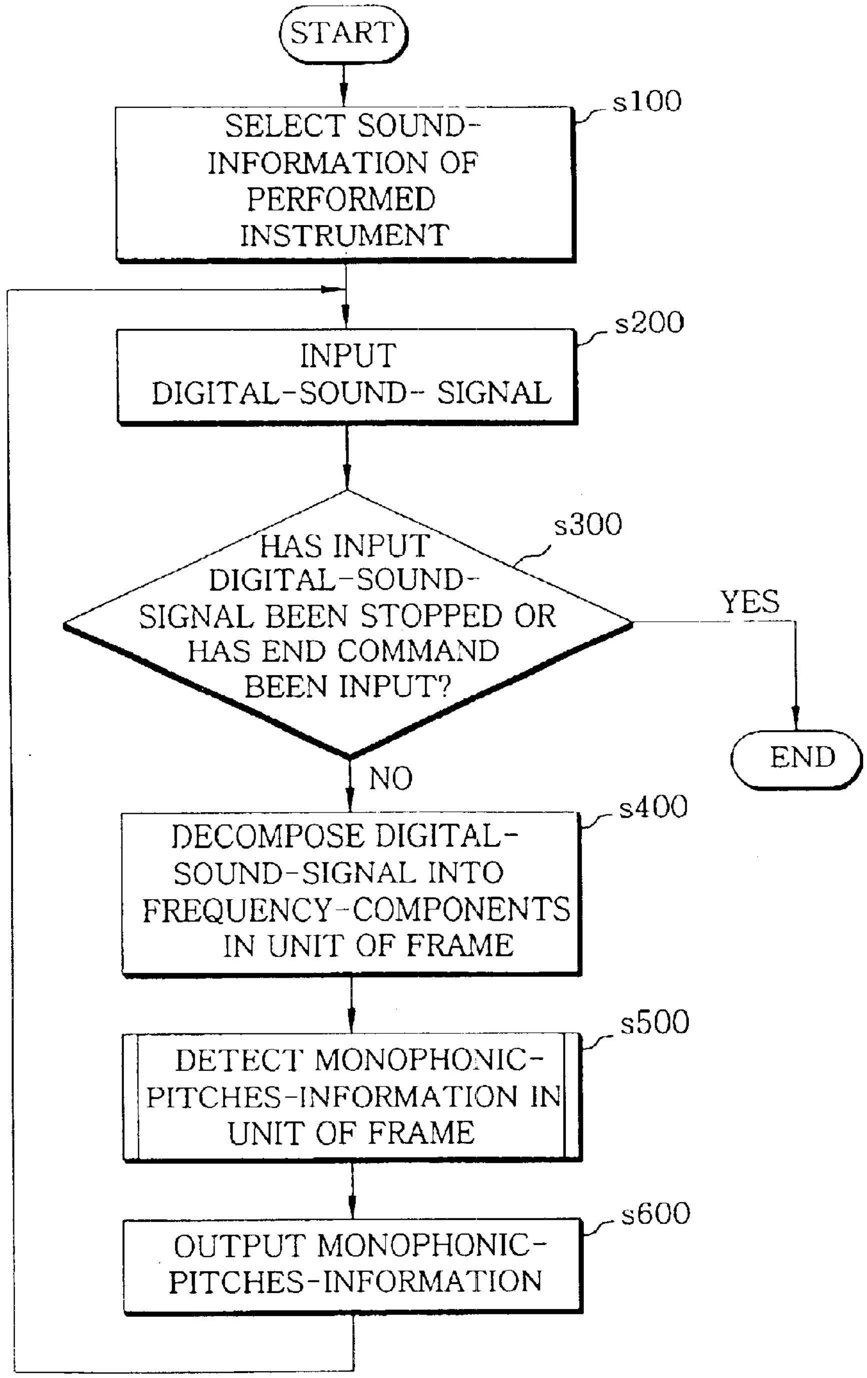
FIG. 10 is a flowchart of a process for analyzing input digital-sounds based on sound-information of different kinds of instruments according to a first embodiment of the present invention.
Figure 10A:
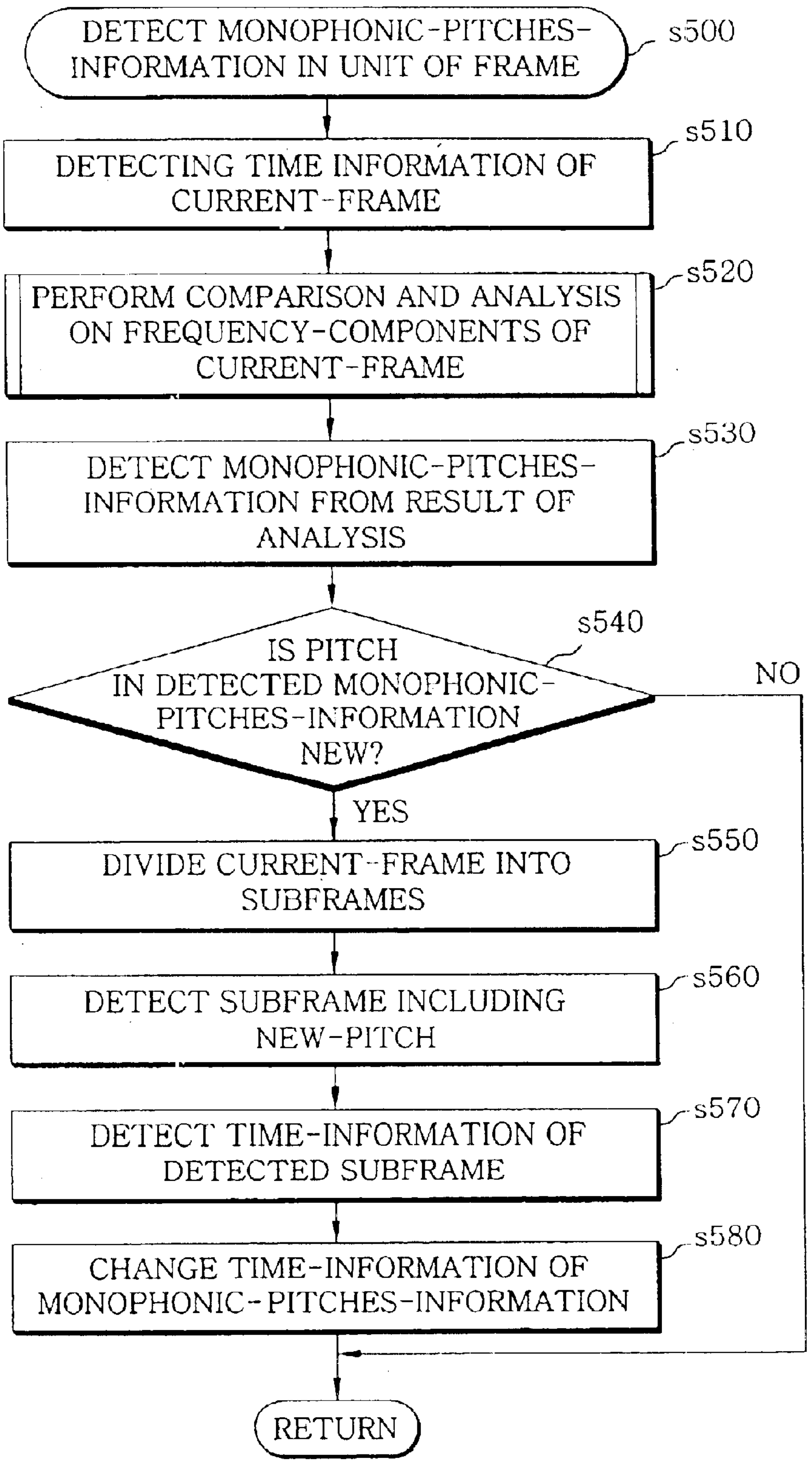
FIG. 10A is a flowchart of a step of detecting monophonic-pitches-information from the input digital-sounds in units of sound frames based on the sound-information of different kinds of instruments according to the first embodiment of the present invention.
Figure 10B:
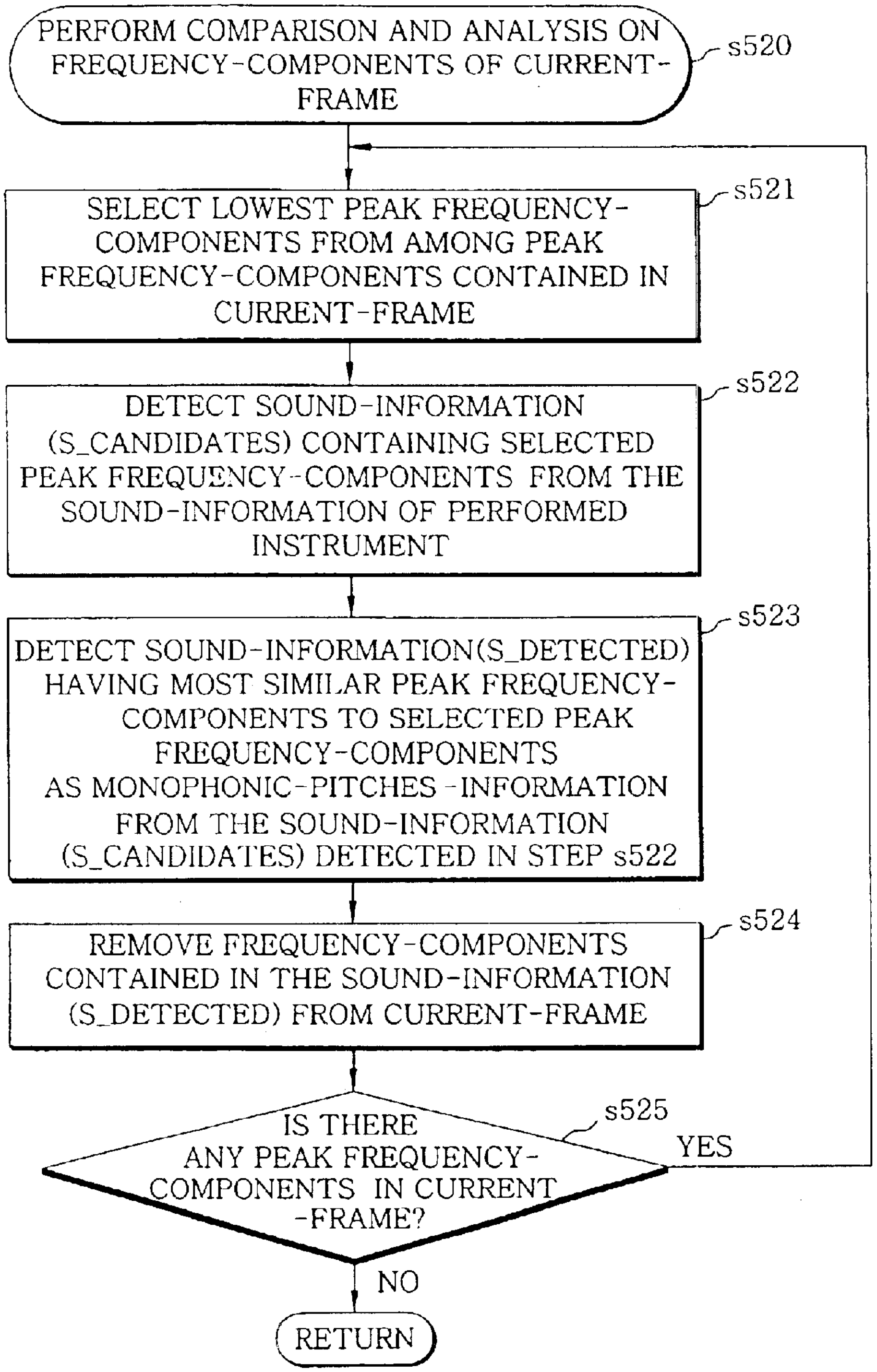
FIG. 10B is a flowchart of a step of comparing frequency-components of the input digital-sounds with frequency-components of sound-information of a performed instrument in frame units and analyzing the frequency-components of the digital-sounds based on the sound-information of different kinds of instruments according to the first embodiment of the present invention.

FIGS. 10 through 10B are flowcharts of a method of analyzing digital-sounds according to a first embodiment of the present invention. The first embodiment of the present invention will be described in detail with reference to the attached drawings.

FIG. 10 is a flowchart of a process for analyzing input digital-sounds based on sound-information of different kinds of instruments according to the first embodiment of the present invention. The process for analyzing input digital-sounds based on sound-information of different kinds of instruments according to the first embodiment of the present invention will be described with reference to FIG. 10.

After sound-information of different kinds of instruments is generated and stored (not shown), sound-information of the instrument for actual performance is selected in step s100. Here, the sound-information of different kinds of instruments is stored in formats as shown in FIGS. 9A through 9E.

Next, if digital-sound-signals are input in step s200, the digital-sound-signals are decomposed into frequency-components in units of frames in step s400. The frequency-components of the digital-sound-signals are compared with the frequency-components of the selected sound-information and analyzed to detect monophonic-pitches-information from the digital-sound-signals in units of frames in step s500. The detected monophonic-pitches-information is output in step s600.

The steps s200 and s400 through s600 are repeated until the input digital-sound-signals are stopped or an end command is input in step s300.

FIG. 10A is a flowchart of the step s500 of detecting monophonic-pitches-information from the input digital-sounds in units of sound frames based on the sound-information of different kinds of instruments according to the first embodiment of the present invention. FIG. 10A shows a procedure for detecting monophonic-pitches-information with respect to a single current-frame. Referring to FIG. 10A, time-information of a current-frame is detected in step s510. The frequency-components of the current-frame are compared with the frequency-components of the selected sound-information and analyzed to detect current pitch and strength information of each of monophonic-notes in the current-frame in step s520. In step s530, monophonic-pitches-information is detected from the current pitch-information, note-strength-information and time-information.

If it is determined that current pitch in the detected monophonic-pitches-information is a new-pitch that is not included in the previous frame in step s540, the current-frame is divided into a plurality of subframes in step s550. A subframe including the new-pitch is detected from among the plurality of subframes in step s560. Time-information of the detected subframe is detected s570. The time-information of the new-pitch is updated with the time-information of the subframe in step s580. The steps s540 through s580 can be omitted when the new-pitch is in a low frequency range, or when the accuracy of time-information is not required.

FIG. 10B is a flowchart of the step s520 of comparing the frequency components of the input digital-sounds with the frequency-components of the sound-information of the performed instrument in frame units and analyzing the frequency-components of the digital-sounds based on the sound-information of different kinds of instruments according to the first embodiment of the present invention.

Referring to FIG. 10B, the lowest peak frequency-components contained in the current frame is selected in step s521. Next, the sound-information (S_CANDIDATES) containing the selected peak frequency-components is detected from the sound-information of the performed instrument in step s522. In step s523, the sound-information (S_DETECTED) having most similar peak-frequency-components to the selected peak-frequency-components is detected as monophonic-pitches-information from the sound-information (S_CANDIDATES) detected in step s522.

If the monophonic-pitches-information corresponding to the lowest peak frequency-components is detected, the lowest peak frequency-components are removed from the frequency-components contained in the current-frame in step s524. Thereafter, it is determined whether there are any peak frequency-components in the current-frame in step s525. If it is determined that there is any, the steps s521 through s524 are repeated.

For example, in the case where three notes C4, E4, and G4 are contained in the current-frame of the input digital-sound-signals, the reference frequency-components of the note C4 is selected as the lowest peak frequency-components from among peak frequency-components contained in the current-frame in step s521.

Next, the sound-information (S_CANDIDATES) containing the reference frequency-component of the note C4 is detected from the sound-information of the performed instrument in step s522. Here, generally, sound-information of the note C4, sound-information of a note C3, sound-information of a note G2, and so on can be detected.

Then, in step s523, among the several sound-information (S_CANDIDATES) detected in step of s522, the sound-information (S_DETECTED) of C4 is selected as monophonic-pitches-information because of the high resemblance of the selected peak frequency-components.

Thereafter, the frequency-components of the detected sound-information (S_DETECTED) (i.e., the note C4) are removed from frequency-components (i.e., the notes C4, E4, and G4) contained in the current-frame of the digital-sound-signals in step s524. Then, the frequency-components corresponding to the notes E4 and G4 remain in the current-frame. The steps s521 through s524 are repeated until there are no frequency-components in the current-frame. Through the above steps, monophonic-pitches-information with respect to all of the notes contained in the current-frame can be detected. In the above case, monophonic-pitches-information with respect to all of the notes C4, E4, and G4 can be detected by repeating the steps s521 through s524 three times.

Hereinafter, a method for analyzing digital-sounds using sound-information according to the present invention will be described based on the following pseudo-code 1. Refer to conventional methods for analyzing digital-sounds for a part of [Pseudo-code 1] which is not described.

Referring to [Pseudo-code 1], digital-sound-signals are input in line 1 and are divided into frames in line 3. Each of the frames is analyzed by repeating a for-loop in lines 4 through 25. Frequency-components are calculated through Fourier transform in line 5, and the lowest peak frequency-components are selected in line 6. Subsequently, in line 7, time-information of a current-frame to be stored in line 21 is detected. The current-frame is analyzed by repeating a while-loop while peak frequency-components exist in lines 8 through 24. Sound-information (candidates) containing the peak frequency-components of the current-frame is detected in line 9. Peak frequency-components contained in the current-frame are compared with those contained in the detected sound-information (candidates) to detect sound-information (sound) containing most similar peak frequency-components to those contained in the current-frame in line 10. Here, the detected sound-information is adjusted to a strength the same as the strength of the peak-frequency of the current-frame. If it is determined that a pitch corresponding to the sound-information detected in line 10 is new one which is not contained in the previous frame in line 11, the size of an FFT window is reduced to extract accurate time information.

To extract the accurate time-information, the current-frame is divided into a plurality of subframes in line 12, and each of the subframes is analyzed by repeating a for-loop in lines 13 through 19. Frequency-components of a subframe are calculated through Fourier transform in line 14. If it is determined that the subframe contains the lowest peak frequency-components selected in line 6 in line 15, time-information corresponding to the subframe is detected in line 16 to be stored in line 21. The time-information detected in line 7 has a large time error in the time-information since a large-size FFT window is applied. However, the time-information detected in line 16 has a small time error in the time-information since a small-size FFT window is applied.

[Pseudo-code 1]

```
line 1   input of digital-sound-signals (das)
line 2
              // division of the das into frames considering the size of a
         n FFT // window and a space between FFT windows (overlap is
         // permitted)
line 3   frame = division of das into frames (das, fft-size, overlap-size)
line 4   for all frames
line 5       x = fft (frame) // Fourier transform
line 6       peak = lowest peak frequency components (x)
line 7       timing = time information of a frame
line 8       while (peak exist)
line 9           candidates = sound information contains (peak)
line 10          sound = most similar sound information (candidates, x)
line 11          if sound is new pitch
line 12              subframe = division of the frame into subframes
                     (frame, sub-size, overlap size)
line 13              for all subframes
line 14                  subx = fft (subframe)
line 15                  if subx includes the peak
line 16                      timing = time information of a subframe
line 17                      exit-for
line 18                  end-if
line 19              end-for
line 20          end-if
line 21          result = new result of analysis (result, timing, sound)
line 22          x = x - sound
line 23          peak = lowest peak frequency components (x)
line 24      end-while
line 25  end-for
line 26  performance = correction by instrument types (result)
```

Because the for-loop from line 13 to line 19 exits in line 17, not the time-information detected in line 7 but the more accurate time-information detected in line 16 is stored in line 21.

As described above, when it is determined that a pitch is new, the size of a unit frame is reduced to detect accurate time-information in lines 11 through 20. As well as the time-information, the pitch-information and the strength-information of the detected pitch are stored in line 21. The frequency-components of the sound-information detected in line 10 is subtracted from the current-frame in line 22, and the next lowest peak frequency-components are searched in line 23 again. The above procedure from line 9 to line 20 is repeated, and the result of analyzing the digital-sound-signals is stored as a result-variable (result) in line 21.

However, the stored result (result) is insufficient to be used as information of actually performed music. In the case of a piano, when a pitch is performed by pressing a key, the pitch is not represented by an accurate frequency-components during an initial stage, onset. Accordingly, the pitch can be usually analyzed accurately only after at least one frame is processed. In this case, if it is considered that a pitch performed on a piano does not change within a very short time (for example, a time corresponding to three or four frames), more accurate performance-information can be detected. Therefore, the result variable (result) is analyzed considering the characteristics of a corresponding instrument and the result of analysis is stored as more accurate performance-information (performance) in line 26.

Figure 11:
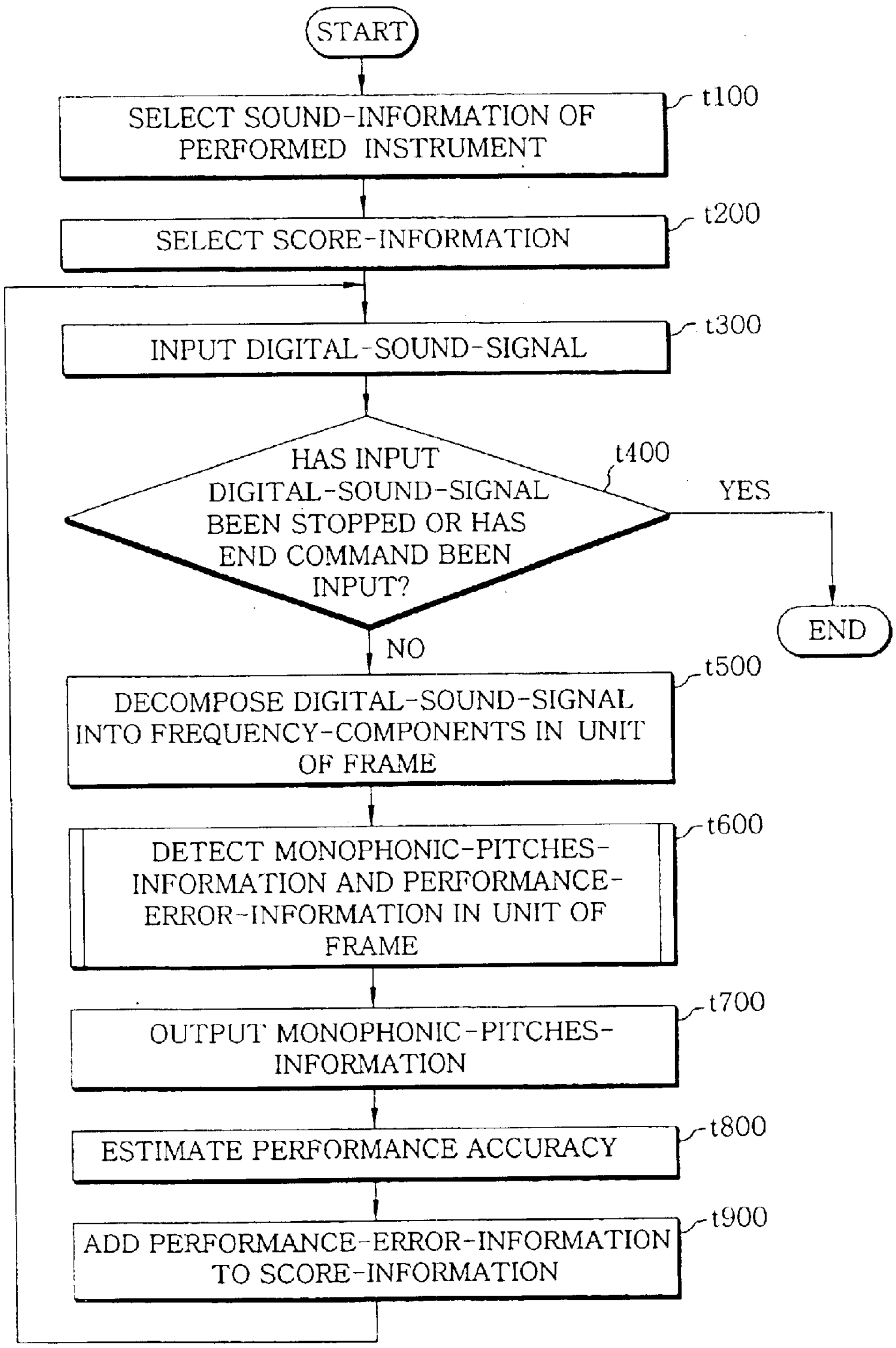
FIG. 11 is a flowchart of a process for analyzing input digital-sounds based on sound-information of different kinds of instruments and score-information according to a second embodiment of the present invention.
Figure 11A:
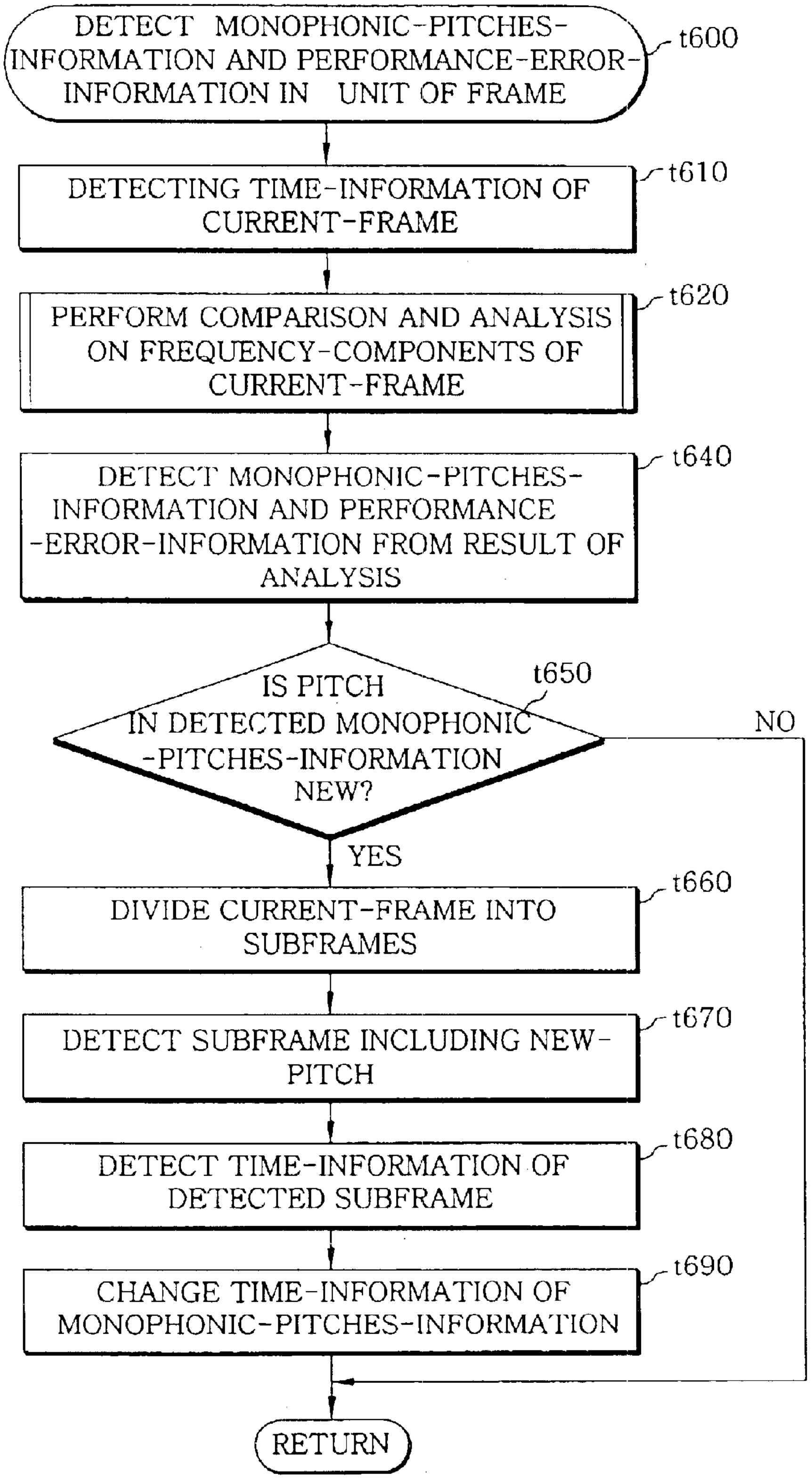
FIG. 11A is a flowchart of a step of detecting monophonic-pitches-information and performance-error-information from the input digital-sounds in units of frames based on the sound-information of different kinds of instruments and the score-information according to the second embodiment of the present invention.
Figure 11B:
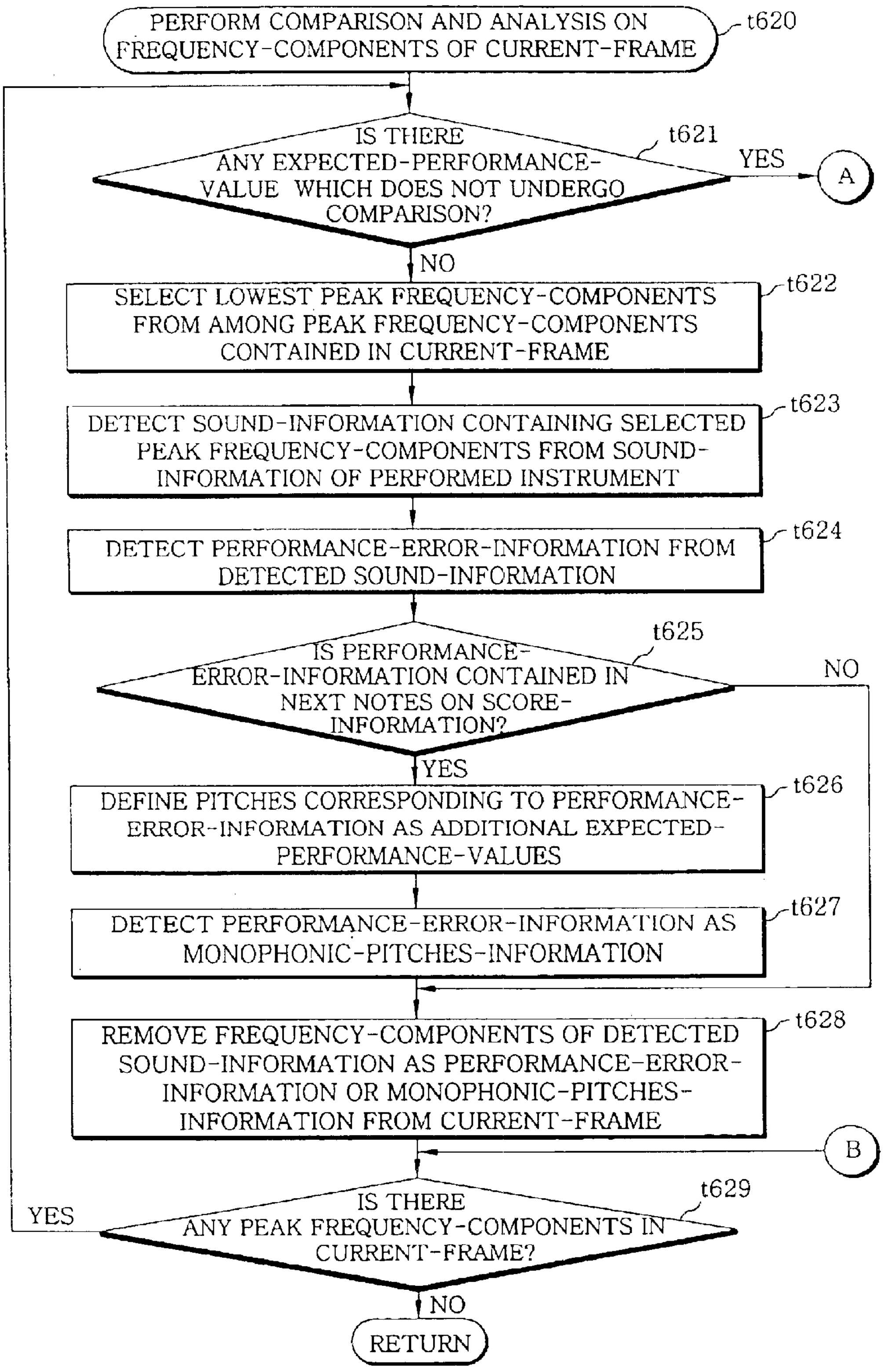
FIGS. 11B and 11C are flowcharts of a step of comparing frequency-components of the input digital-sounds with frequency-components of the sound-information of a performed instrument in frame units and analyzing the frequency-components of the digital-sounds based on the sound-information and the score-information according to the second embodiment of the present invention.
Figure 11C:
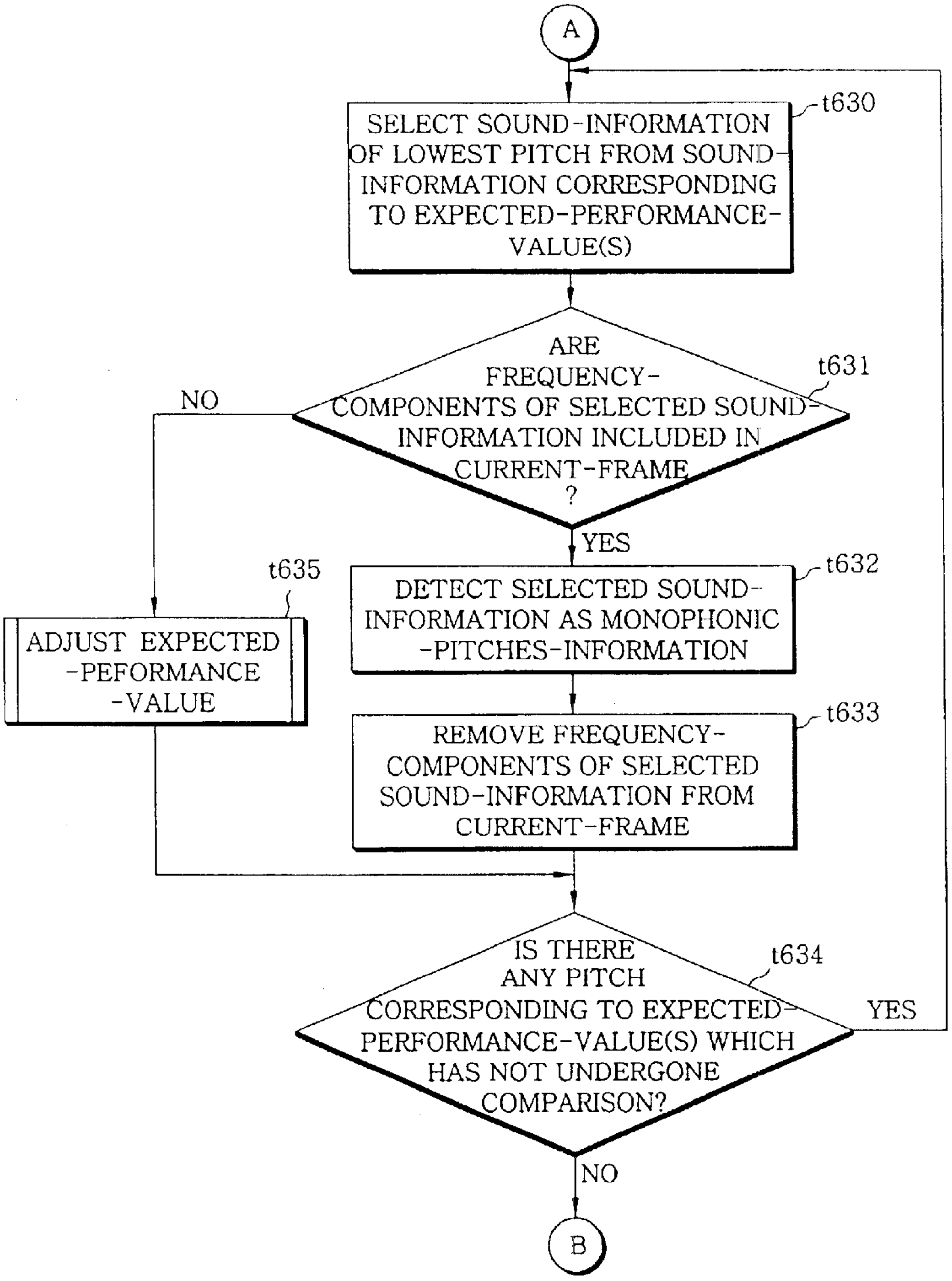
Figure 11D:
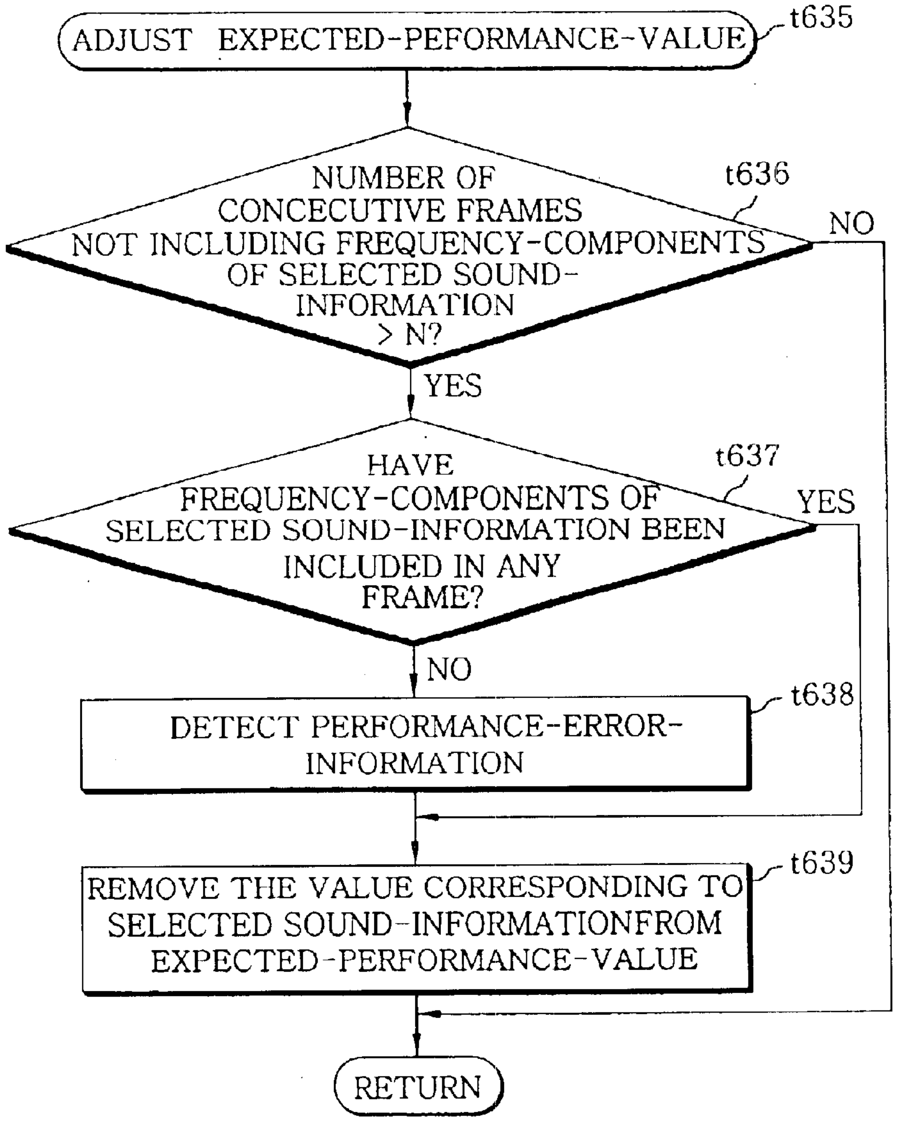
FIG. 11D is a flowchart of a step of adjusting the expected-performance-value based on the sound-information of different kinds of instruments and the score-information according to the second embodiment of the present invention.

FIGS. 11 through 11D are flowcharts of a method of analyzing digital sounds according to a second embodiment of the present invention. The second embodiment of the present invention will be described in detail with reference to the attached drawings.

In the second embodiment, both sound-information of different kinds of instruments and score-information of music to be performed are used. If all available kinds of information according to changes in frequency-components of each pitch can be constructed as sound-information, input digital-sound-signals can be analyzed very accurately. However, it is difficult to construct such sound-information in an actual state. The second embodiment is provided considering the above difficulty. In other words, in the second embodiment, score-information of music to be performed is selected so that next input notes can be predicted based on the score-information. Therefore, input digital-sounds are analyzed using the sound-information corresponding to the predicted notes.

FIG. 11 is a flowchart of a process for analyzing input digital-sounds based on sound-information of different kinds of instruments and score-information according to the second embodiment of the present invention. The process for analyzing input digital sounds based on sound-information of different kinds of instruments and score-information according to the second embodiment of the present invention will be described with reference to FIG. 11.

After sound-information of different kinds of instruments and score-information of music to be performed are generated and stored (not shown), sound-information of the instrument for actual performance and score-information of music to be actually performed are selected among stored sound-information and score-information in steps t100 and t200. Here, the sound-information of different kinds of instruments is stored in formats as shown in FIGS. 9A through 9E. Meanwhile, a method of generating score-information of music to be performed is beyond the scope of the present invention. At present, there are many types of techniques of scanning printed scores, converting the scanned scores into MIDI data, and storing the performance-information. Thus, a detailed description of generating and storing score-information will be omitted.

The score-information includes pitch-information, note length-information, speed-information, tempo-information, note strength-information, detailed performance-information (e.g., staccato, staccatissimo, and pralltriller), and discrimination-information for performance using two hands or a plurality of instruments.

After the sound-information and score-information are selected in steps t100 and t200, if digital-sound-signals are input in step t300, the digital-sound-signals are decomposed into frequency-components in units of frames in step t500. The frequency-components of the digital-sound-signals are compared with the selected score-information and the frequency-components of the selected sound-information of the performed instrument and analyzed to detect performance-error-information and monophonic-pitches-information from the digital-sound-signals in step t600. Thereafter, the detected monophonic-pitches-information is output in step t700.

Performance accuracy can be estimated based on the performance-error-information in step t800. If the performance-error-information corresponds to a pitch (for example, a variation) intentionally performed by a player, the performance-error-information is added to the existing score-information in step t900. The steps t800 and t900 can be selectively performed.

FIG. 11A is a flowchart of the step t600 of detecting monophonic-pitches-information and performance-error-information from the input digital-sounds in units of frames based on the sound-information of different kinds of instruments and the score-information according to the second embodiment of the present invention. FIG. 11A shows a procedure for detecting monophonic-pitches-information and performance-error-information with respect to a single current-frame. Referring to FIG. 11A, time-information of the current-frame is detected in step t610. The frequency-components of the current-frame are compared with the frequency-components of the selected sound-information of the performed instrument and with the score-information and analyzed to detect current pitch and strength information of each of pitches in the current-frame in step t620. In step t640, monophonic-pitches-information and performance-error-information are detected from the detected pitch-information, note strength-information and time-information.

If it is determined that current pitch in the detected monophonic-pitches-information is a new one that is not included in the previous frame in step t650, the current-frame is divided into a plurality of subframes in step t660. A subframe including the new pitch is detected from among the plurality of subframes in step t670. Time-information of the detected subframe is detected t680. The time-information of the new pitch is updated with the time-information of the subframe in step t690. Similar to the first embodiment, the steps t650 through t690 can be omitted when the new pitch is in a low frequency range, or when the accuracy of time-information is not required.

FIGS. 11B and 11C are flowcharts of the step t620 of comparing frequency-components of the input digital-sounds with frequency-components of the sound-information of a performed instrument in frame units based on the score-information, and analyzing the frequency-components of the digital-sounds based on the sound-information and the score-information according to the second embodiment of the present invention.

Referring to FIGS. 11B and 11C, in step t621, an expected-performance-value of the current-frame is generated referring to the score-information in real time, and it is determined whether there is any note in the expected-performance-value that is not compared with the digital-sound-signals in the current-frame.

If it is determined that there is no note in the expected-performance-value which is not compared with the digital-sound-signals in the current-frame in step t621, it is determined whether frequency-components of the digital-sound-signals in the current-frame correspond to performance-error-information, and performance-error-information and monophonic-pitches-information are detected, and the frequency-components of sound-information corresponding to the performance-error-information and the monophonic-pitches-information are removed from the digital-sound-signals in the current-frame, in steps t622 through t628.

More specifically, the lowest peak frequency-components of the input digital-sound-signals in the current-frame are selected in step t622. Sound-information containing the selected peak frequency-components is detected from the sound-information of the performed instrument in step t623. Sound-information containing most similar peak frequency-components to the frequency-components of the selected peak frequency-components is detected from the sound-information detected in step t623 as performance-error-information in step t624. If it is determined that the current pitches of the performance-error-information are contained in next notes in the score-information in step t625, the current pitches of the performance-error-information are added to the expected-performance-value in step t626. Next, the current pitches of the performance-error-information are moved into the monophonic-pitches-information in step t627. The frequency-components of the sound-information detected as the performance-error-information or the monophonic-pitches-information in step t624 or t627 are removed from the current-frame of the digital-sound-signals in step t628.

If it is determined that there is any note in the expected-performance-value which is not compared with the digital-sound-signals in the current-frame in step t621, the digital-sound-signals are compared with the expected-performance-value and analyzed to detect monophonic-pitches-information from the digital-sound-signals in the current-frame, and the frequency-components of the sound-information detected as the monophonic-pitches-information are removed from the digital-sound-signals, in steps t630 through t634.

More specifically, sound-information of the lowest pitch which is not compared with frequency-components contained in the current-frame of the digital-sound-signals is selected from the sound-information corresponding to the expected-performance-value which has not undergone comparison in step t630. If it is determined that the frequency-components of the selected sound-information are included in frequency-components contained in the current-frame of the digital-sound-signals in step t631, the selected sound-information is detected as monophonic-pitches-information in step t632. Then, the frequency-components of the selected sound-information are removed from the current-frame of the digital-sound-signals in step t633. If it is determined that the frequency-components of the selected sound-information are not included in the frequency-components contained in the current-frame of the digital-sound-signals in step t631, the expected-performance-value is adjusted in step t635. The steps t630 through t633 are repeated until it is determined that every pitch in the expected-performance-value has undergone comparison in step t634.

The steps t621 through t628 and t630 through t635 shown in FIGS. 11B and 11C are repeated until it is determined that no peak frequency-components are left in the digital-sound-signals in the current-frame in step t629.

FIG. 11D is a flowchart of the step t635 of adjusting the expected performance value according to the second embodiment of the present invention. Referring to FIG. 11D, if it is determined that the frequency-components of the selected sound-information are not included in at least a predetermined-number (N) of consecutive previous frames in step t636, and if it is determined that the frequency-components of the selected sound-information are included in the digital-sound-signals at one or more time points in step t637, the notes corresponding to the selected sound-information are removed from the expected-performance-value in step t639. Alternatively, if it is determined that the frequency-components of the selected sound-information are not included in at least a predetermined number (N) of consecutive previous frames in step t636, and if it is determined that the frequency-components of the selected sound-information are never included in the digital-sound-signals in step t637, the selected sound-information is detected as the performance-error-information in step t638, and the notes corresponding to the selected sound-information are removed from the expected-performance-value in step t639.

Hereinafter, a method for analyzing digital-sounds using sound-information and score-information according to the present invention will be described based on the following pseudo-code 2.

[Pseudo-code 2]

```
line 1    input of score information (score)
line 2    input of digital sound signals (das)
line 3    frame = division of das into frames (das, fft-size, overlap-size)
line 4    current performance value (current) =
              previous performance value (prev) = NULL
line 5    next performance value (next) = pitches to be initially performed
line 6    for all frames
line 7        x = fft (frame)
line 8        timing = time information of a frame
line 9        for all pitches (sound) in next & not in (current, prev)
line 10           if sound is contained in the frame
```

-continued

[Pseudo-code 2]

```
line 11                 prev = prev + current
line 12                 current = next
line 13                 next = pitches to be performed next
line 14                 exit-for
line 15             end-if
line 16         end-for
line 17         for all pitches (sound) in prev
line 18             if sound is not contained in the frame
line 19                 prev = prev − sound
line 20             end-if
line 21         end-for
line 22         for all pitches (sound) in (current, prev)
line 23             if sound is not contained in the frame
line 24                 result = performance error (result, timing, sound)
line 25             else // if sound is contained in the frame
line 26                 sound = adjustment of strength (sound, x)
line 27                 result = new result of analysis (result, timing, sound)
line 28                 x = x − sound
line 29             end-if
line 30         end-for
line 31         peak = lowest peak frequency (x)
line 32         while (peak exist)
line 33             candidates = sound information contains (peak)
line 34             sound = most similar sound information (candidates, x)
line 35             result = performance error (result, timing, sound)
line 36             x = x − sound
line 37             peak = lowest peak frequency components (x)
line 38         end-while
line 39     end-for
line 40     performance = correction by instrument types (result)
```

Referring to [Pseudo-code 2], in order to use both score-information and sound-information, first, score-information is received in line 1. This pseudo-code is a most basic example of analyzing digital-sounds by comparing information of each of performed pitches with the digital-sounds using only note-information in the score-information. Score-information input in line 1 is used to detect a next-performance-value (next) in lines 5 and 13. That is, the score-information is used to detect expected-performance-value for each frame. Subsequently, like Pseudo-code 1 using sound-information, digital-sound-signals are input in line 2 and are divided in to a plurality of frames in line 3. The current-performance-value (current) and the previous-performance-value (prev) are set as NULL in line 4. The current-performance-value (current) corresponds to information of notes on the score corresponding to pitches contained in the current-frame of the digital-sound-signals, the previous-performance-value (prev) corresponds to information of notes on the score corresponding to pitches included in the previous frame of the digital-sound-signals, and the next-performance-value (next) corresponds to information of notes on the score corresponding to pitches predicted to be included in the next frame of the digital-sound-signals.

Thereafter, analysis is performed on all of the frames by repeating a for-loop in line 6 through line 39. Fourier transform is performed on a current-frame to detect frequency-components in line 7. It is determined whether performance proceeds to the next according to the score in lines 9 through 16. In other words, if a new pitch which is not contained in the current-performance-value (current) and the previous-performance-value (prev) but is contained only in the next-performance-value (next) is contained in the current-frame of the digital-sound-signals, it is determined that performance has proceeded to the next position in the score-information. Here, the previous-performance-value (prev), the current-performance-value (current), and the next-performance-value (next) are appropriately changed. Among notes included in the previous-performance-value (prev), notes which are not included in the current frame of the digital-sound-signals are found and removed from the previous-performance-value (prev) in lines 17 through 21, thereby nullifying pitches which are continued in the real performance but have passed away in the score. It is determined whether each of the pieces of sound-information (sound) contained in the current-performance-value (current) and the previous-performance-value (prev) is contained in the current frame of the digital sound signals in lines 22 through 30. If it is determined that the corresponding sound-information (sound) is not contained in the current frame of the digital sound signals, the fact that the performance is different from the score is stored as the result. If it is determined that the sound-information (sound) is contained in the current frame of the digital sound signals, sound-information (sound) is detected according to the strength of the sound contained in the current frame and pitch information, strength information, and time information are stored. As described above, in lines 9 through 30, score information corresponding to the pitches included in the current frame of the digital sound signals is set as the current-performance-value (current), score-information corresponding to pitches included in the previous frame of the digital-sound-signals is set as the previous-performance-value (prev), score-information corresponding to pitches predicted to be included in the next frame of the digital-sound-signals is set as the next-performance-value (next), the previous-performance-value (prev) and the current-performance-value (current) are set as expected-performance-value, and the digital-sound-signals is analyzed based on notes corresponding to the expected-performance-value, so analysis of the digital-sound-signals can be performed very accurately and quickly.

Moreover, considering the case where music is differently performed from the score-information, line 31 is added.

When peak frequency-components are left after analysis of pitches contained in the score-information was completed, the remained peak frequency-components correspond to notes differently performed from the score-information. Accordingly, the notes corresponding to the remained peak frequency-components are detected using the algorithm of Pseudo-code 1 using sound-information, and the fact that the music is differently performed from the score is stored as in line 23 of Pseudo-code 2. For Pseudo-code 2, a method of using score-information has been mainly described, and other detailed descriptions are omitted. Like a method using only sound-information, the method using sound-information and score-information can include lines 11 through 20 of Pseudo-code 1 in which the size of a unit frame for analysis is reduced in order to detect accurate time-information.

However, the result of analysis and the performance error as the result-variable (result) are insufficient to be used as information of actually performed music. For the same reason as described in Pseudo-code 1, and considering that although different pitches start at the same time according to the score-information, a very slight time difference among the pitches can occur in actual performance, the result-variable (result) is analyzed considering the characteristics of a corresponding instrument and the characteristics of a player, and the result of analysis is revised with (performance) in line 40.

Hereinafter, the frequency characteristics of digital-sounds and musical-instrument sound-information will be described in detail.

Figure 1:
FIG. 1 is a diagram of a score corresponding to the first two measures of the second movement in Beethoven's Piano Sonata No. 8.
Figure 2:
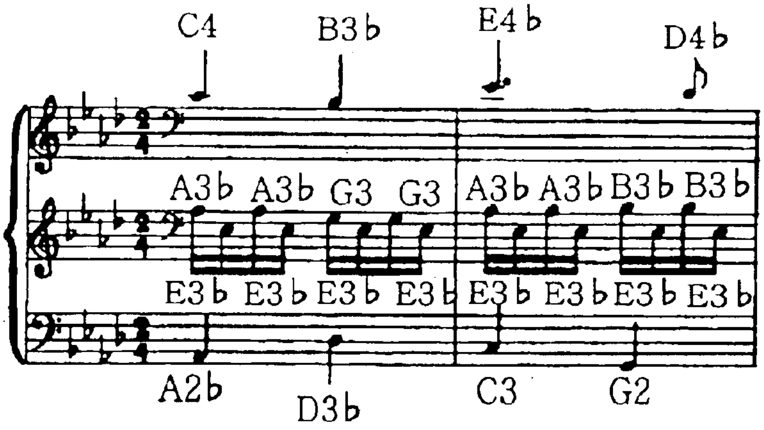
FIG. 2 is a diagram of a score in which polyphonic-notes in the score shown in FIG. 1 are divided into monophonic-notes.
Figure 3:
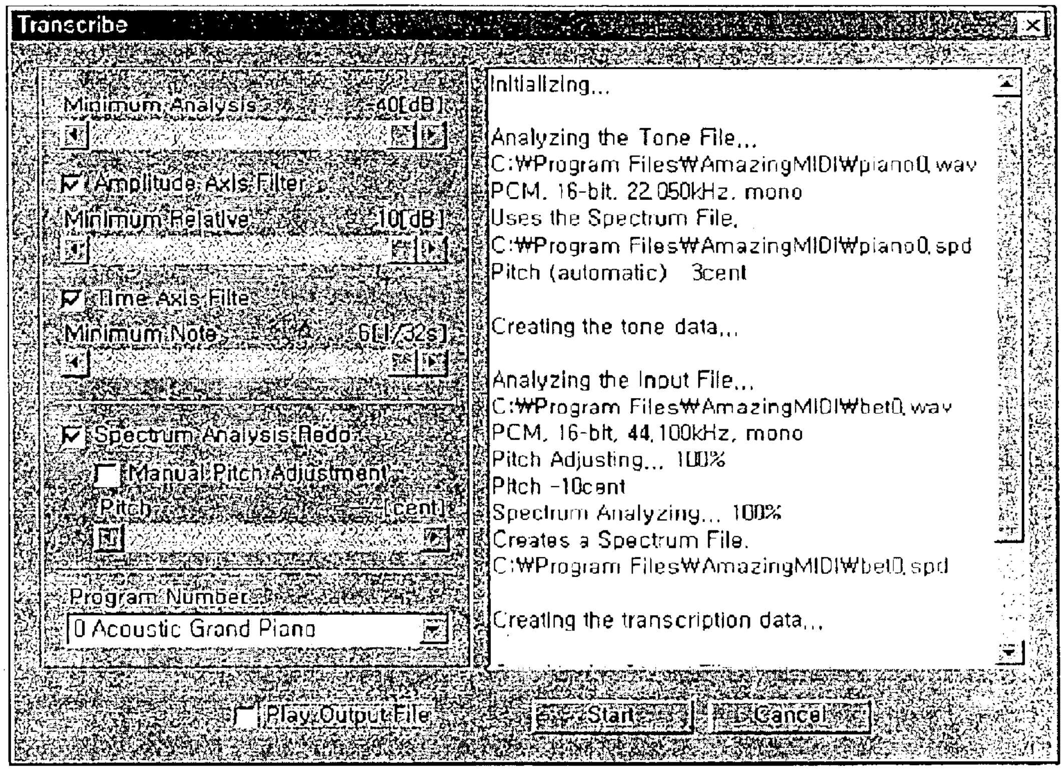
FIG. 3 is a diagram of a parameter-setting-window of AmazingMIDI program.
Figure 4:
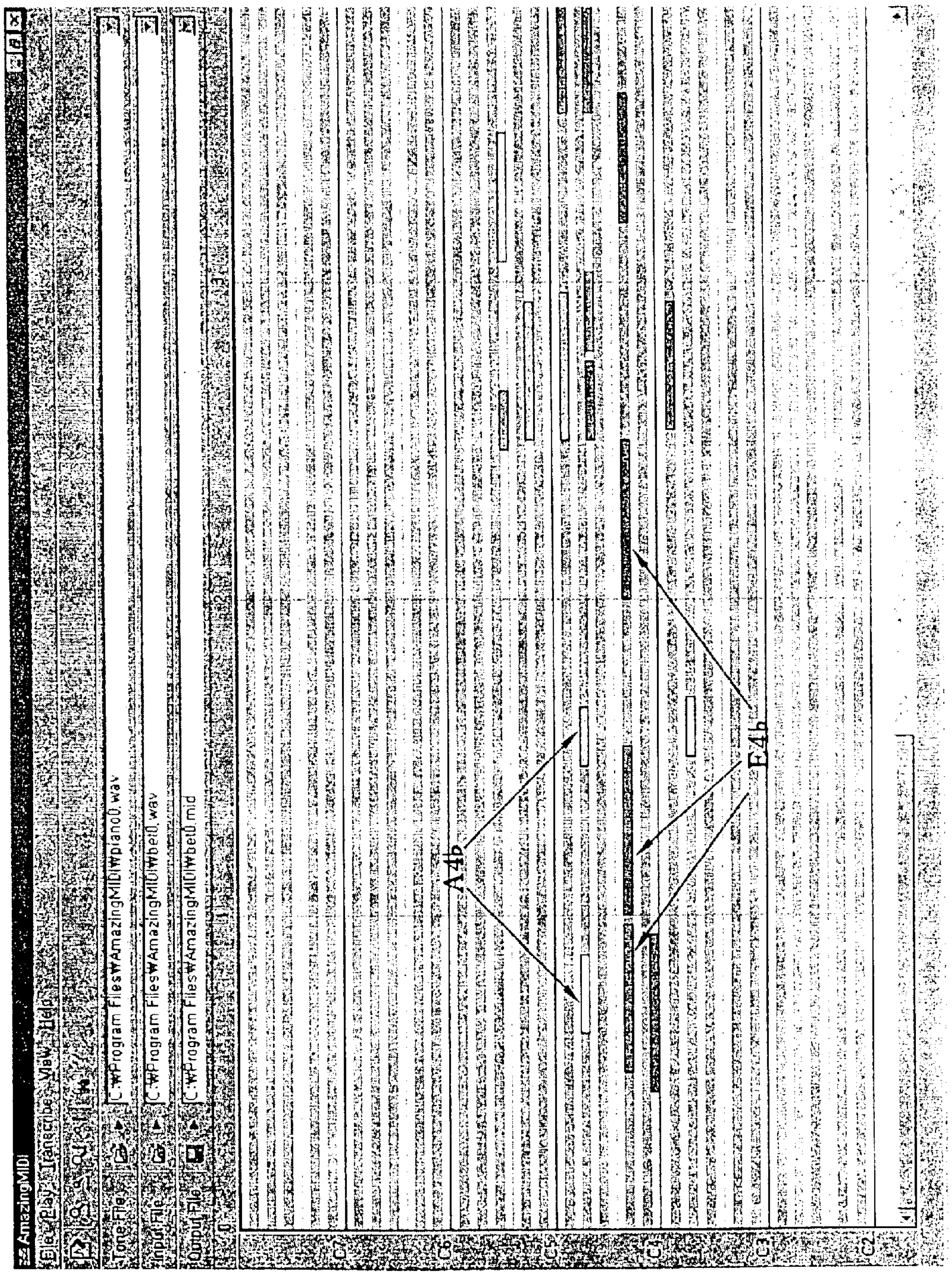
FIG. 4 is a diagram of one result of converting actual performed notes of the score shown in FIG. 1 into MIDI data using AmazingMIDI program.
Figure 5:
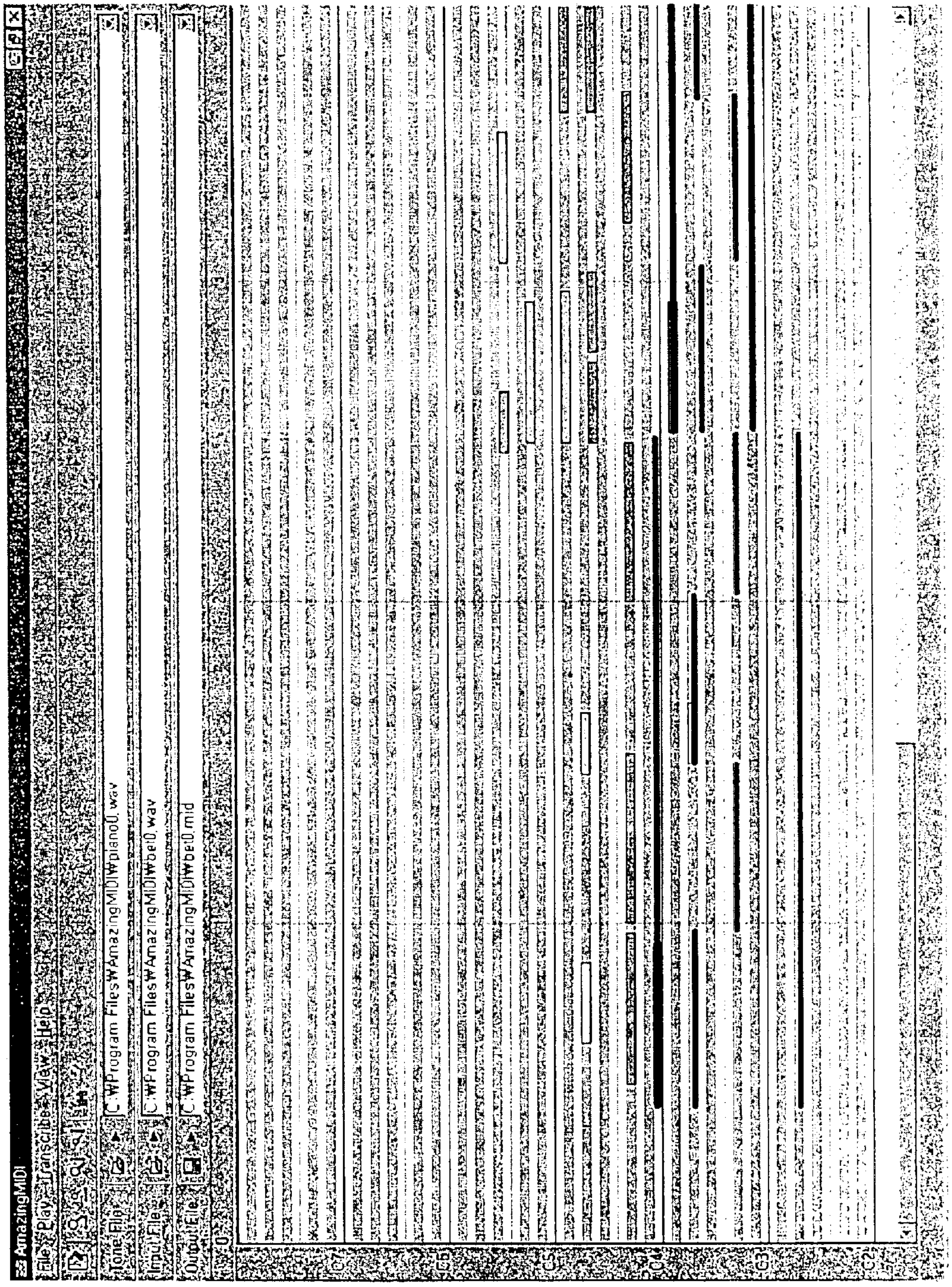
FIG. 5 is a diagram in which the actual performed notes are expressed as black bars on FIG. 4.
Figure 6:
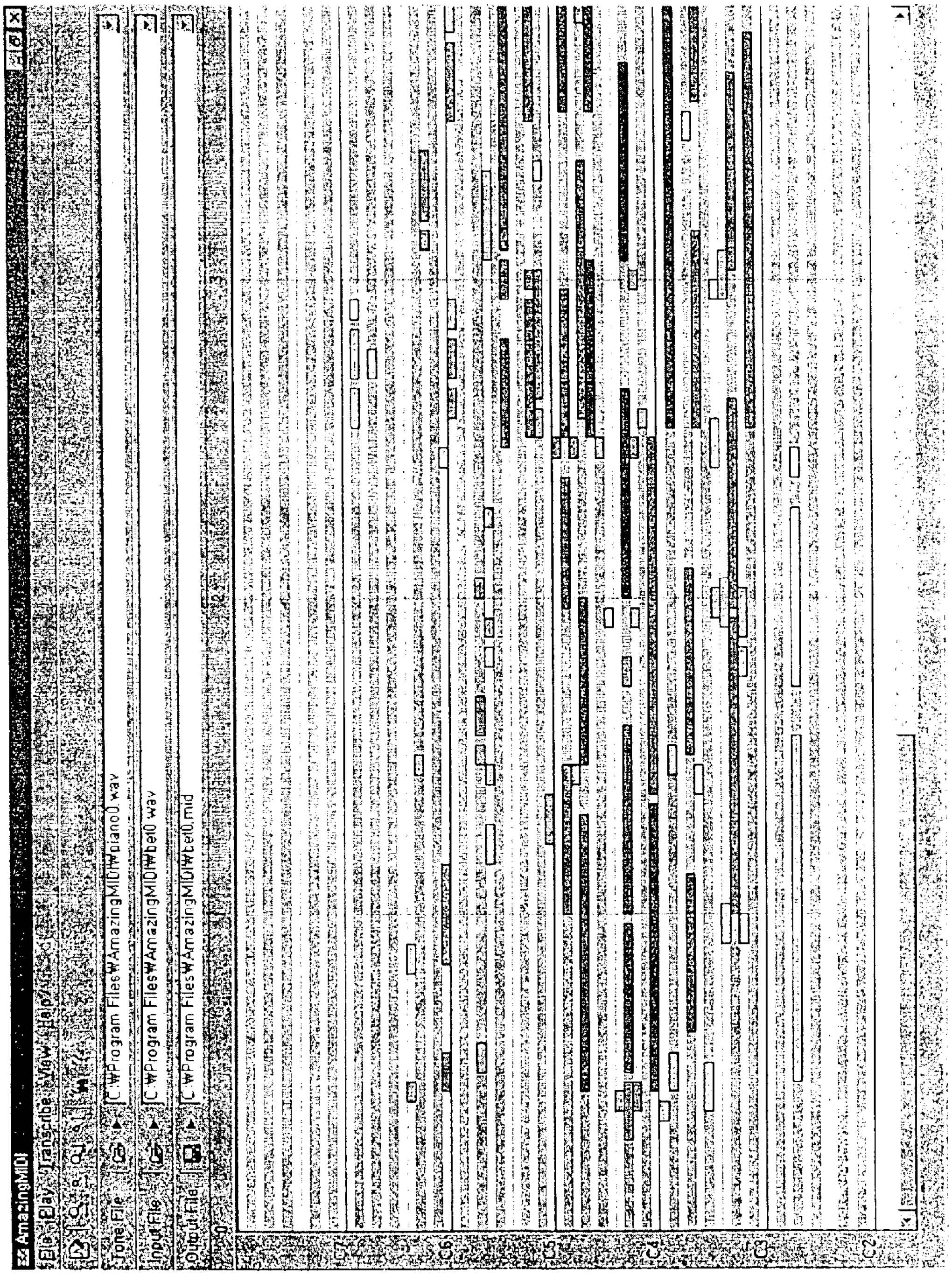
FIG. 6 is a diagram of another result of converting actual performed notes of the score shown in FIG. 1 into MIDI data using AmazingMIDI program.
Figure 7:
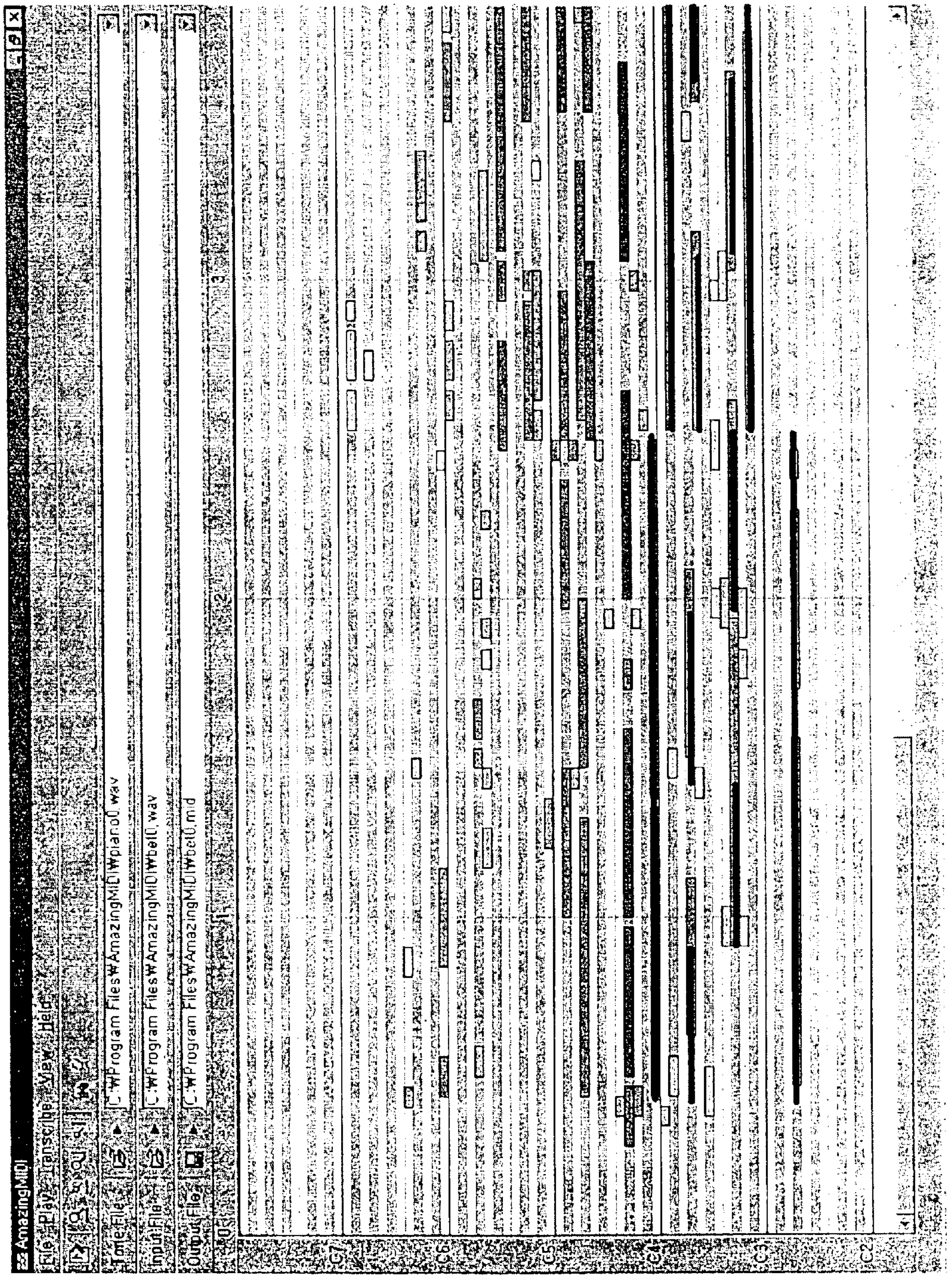
FIG. 7 is a diagram in which the actual performed notes are expressed as black bars on FIG. 6.
Figure 12:
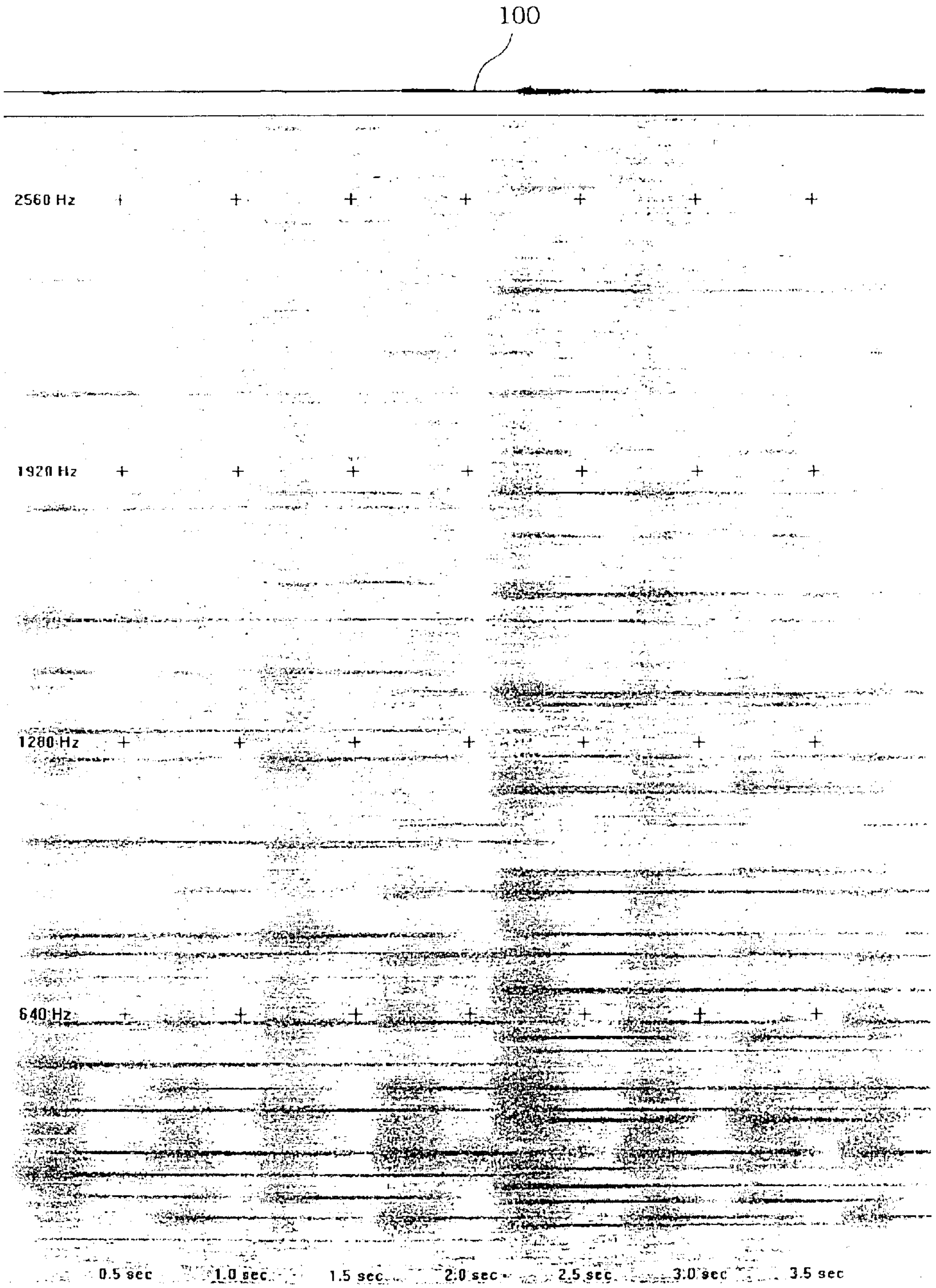
FIG. 12 is a diagram of the result of analyzing the frequency-components of the sound of a piano played according to the first measure of the score shown in FIGS. 1 and 2.

FIG. 12 is a diagram of the result of analyzing the frequency-components of the acoustic-piano-sounds according to the first measure of the score shown in FIGS. 1 and 2. In other words, FIG. 12 is a spectrogram of piano sounds performed according to the first measure of the second movement in Beethoven's Piano Sonata No. 8. Here, a grand piano made by the Young-chang piano company was used. A microphone was connected to a notebook computer made by Sony, and the sound was recorded using a recorder in a Windows auxiliary program. Freeware, a Spectrogram 5.1.6 version, developed and published by R. S. Horne was used as a program for analyzing and displaying the spectrogram. A scale was set to 90 dB, a time scale was set to 5 msec, a fast Fourier transform (FFT) size was set to 8192, and default values are used for the others. Here, the scale set to 90 dB indicates that sound of less than −90 dB is ignored and not displayed. The time scale set to 5 msec indicates that Fourier transform is performed with FFT windows overlapping every 5 msec to display an image.

A line 100 shown at the top of FIG. 12 indicates the strength of input digital sound signals. Below the line 100, frequency-components contained in the digital sound signals are displayed by frequencies. A darker portion shows the magnitude of the frequency-component is lager than the bright ones. Accordingly, changes in the magnitude of the individual frequency-components in the flow of time can be caught at a glance. Referring to FIGS. 12 and 2, it can be seen that pitch-frequencies and harmonic-frequencies corresponding to the individual notes shown in the score of FIG. 2 are shown in FIG. 12.

FIGS. 13A through 13G are diagrams of the results of analyzing the frequency-components of the sounds of individual notes performed on the piano, which are contained in the first measure of the score of FIG. 2.

Each of the notes contained in the first measure of FIG. 2 was independently performed and recorded in the same environment, and the result of analyzing each recorded note was displayed as a spectrogram. In other words, FIGS. 13A through 13G are spectrograms of the piano sounds corresponding to the notes C4, A2♭, A3♭, E3♭, B3♭, D3♭, and G3, respectively. FIGS. 13A through 13G show the magnitudes of each of frequency-components for 4 seconds. The conditions of analysis were set to be the same as those in the case of FIG. 12. The note C4 has a pitch-frequency of 262 Hz and harmonic-frequencies of n multiples of the pitch-frequency, for example, 523 Hz, 785 Hz, and 1047 Hz. This can be confirmed in FIG. 13A. In other words, it shows that frequency-components of 262 Hz and 523 Hz are strong in near black portions, and the magnitude roughly decreases from a frequency of 785 Hz toward a higher multiple harmonic-frequencies. The pitch-frequency and harmonic-frequencies of the note C4 are denoted by C4.

The note A2♭ has a pitch frequency of 104 Hz. Referring to FIG. 13B, the harmonic-frequencies of the note A2♭ is much stronger than its pitch frequency. Referring to FIG. 13B only, because that the note A2♭'s $3^{rd}$ harmonic-frequency 311 Hz is strongest among the frequency-components displayed, this note A2♭ may be erroneously recognized as the note E4♭ having pitch-frequency 311 Hz if the note is determined by order of the magnitude of frequency-components.

In addition, if the notes are determined by their magnitudes of the frequency-components in FIGS. 13C through 13G, the same error can occur.

FIGS. 14A through 14G are diagrams of the results of indicating the frequency-components of each of the notes contained in the first measure of the score of FIG. 2 on FIG. 12.

Figure 13A:
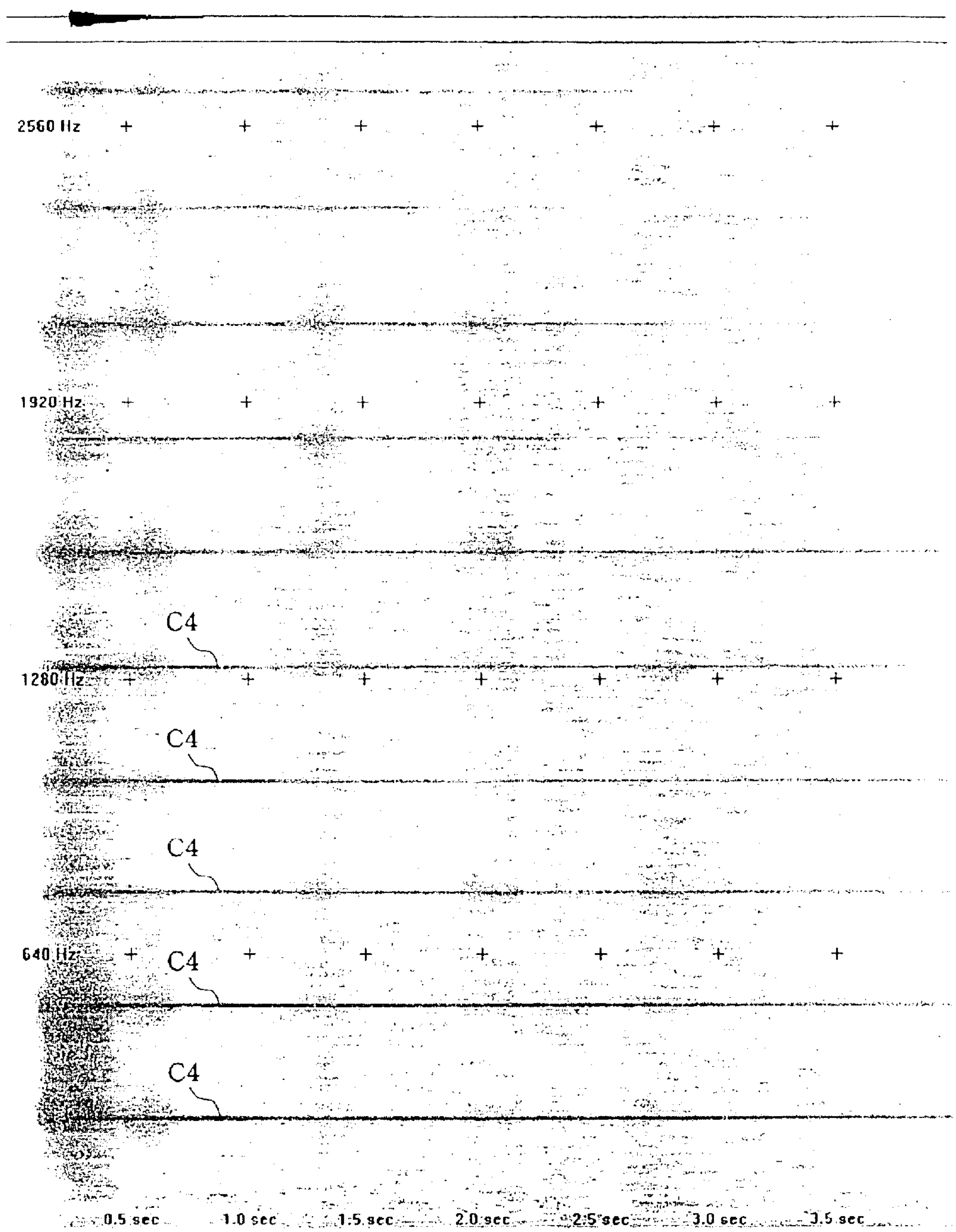
FIGS. 13A through 13G are diagrams of the results of analyzing the frequency-components of the sounds of individual notes performed on a piano, which are contained in the first measure of the score.
Figure 13B:
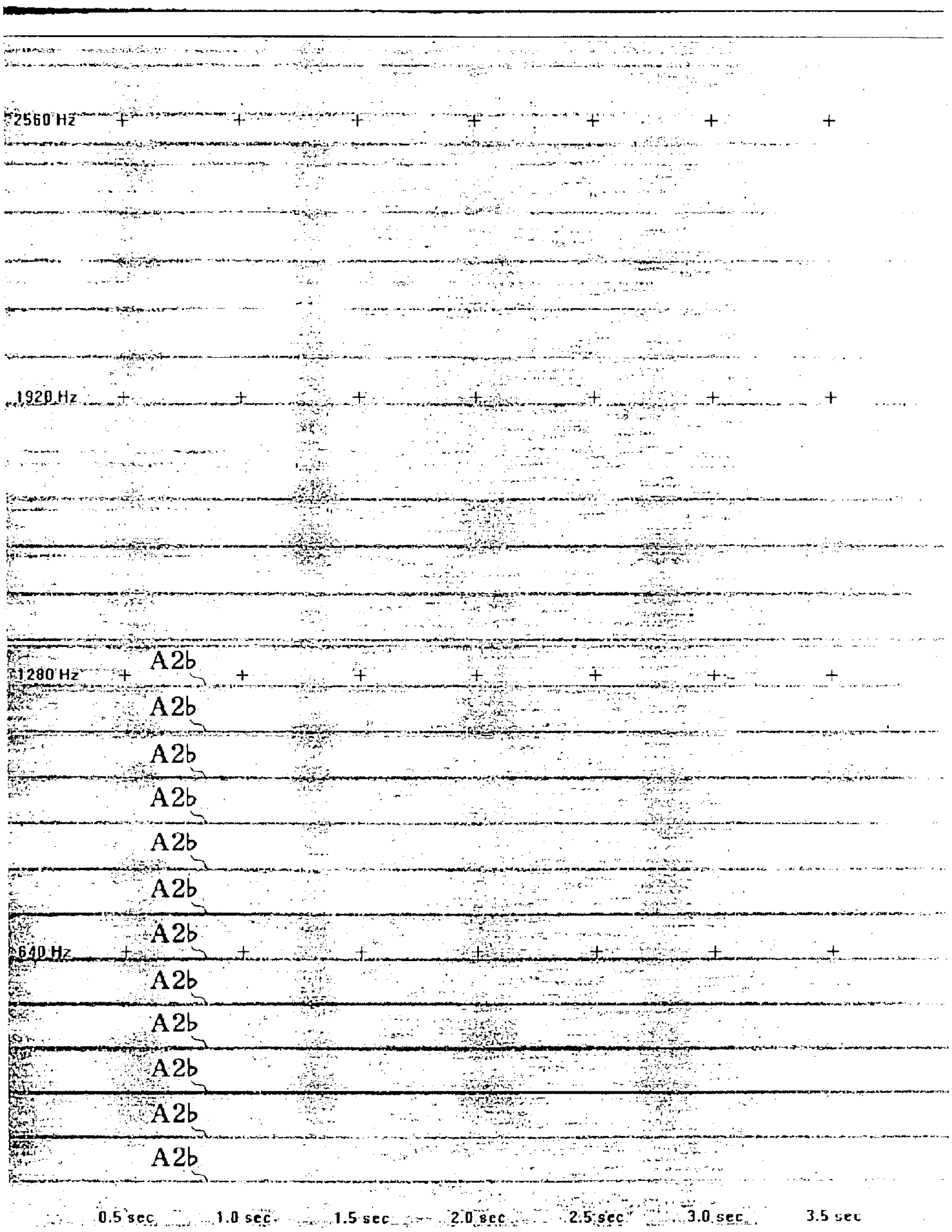
Figure 14A:
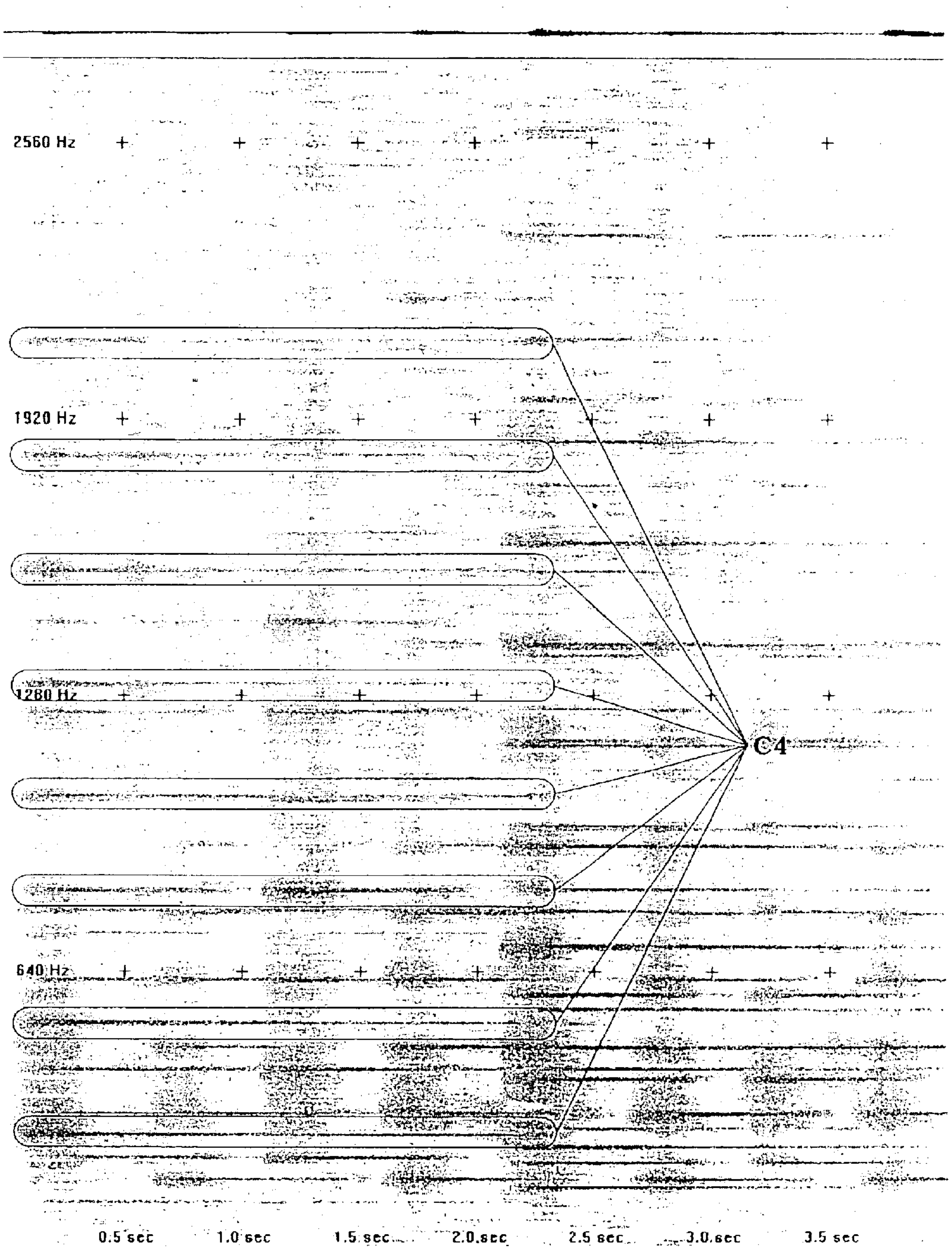
FIGS. 14A through 14G are diagrams of the results of indicating the frequency-components of each of the notes contained in the first measure of the score on FIG. 12.

FIG. 14A shows the frequency-components of the note C4 shown in FIG. 13A indicated on FIG. 12. Since the strength of the note C4 shown in FIG. 13A is greater than that shown in FIG. 12, the harmonic-frequencies of the note C4 shown in the upper portion of FIG. 12 are vague or too weak to be identified. However, if the frequency-magnitudes of FIG. 13A are lowered to match the magnitude of the pitch-frequency of the note C4 shown in FIG. 12 and compared with those of FIG. 12, it can be seen that the frequency-components of the note C4 are included in FIG. 12, as shown in FIG. 14A.

Figure 13C:
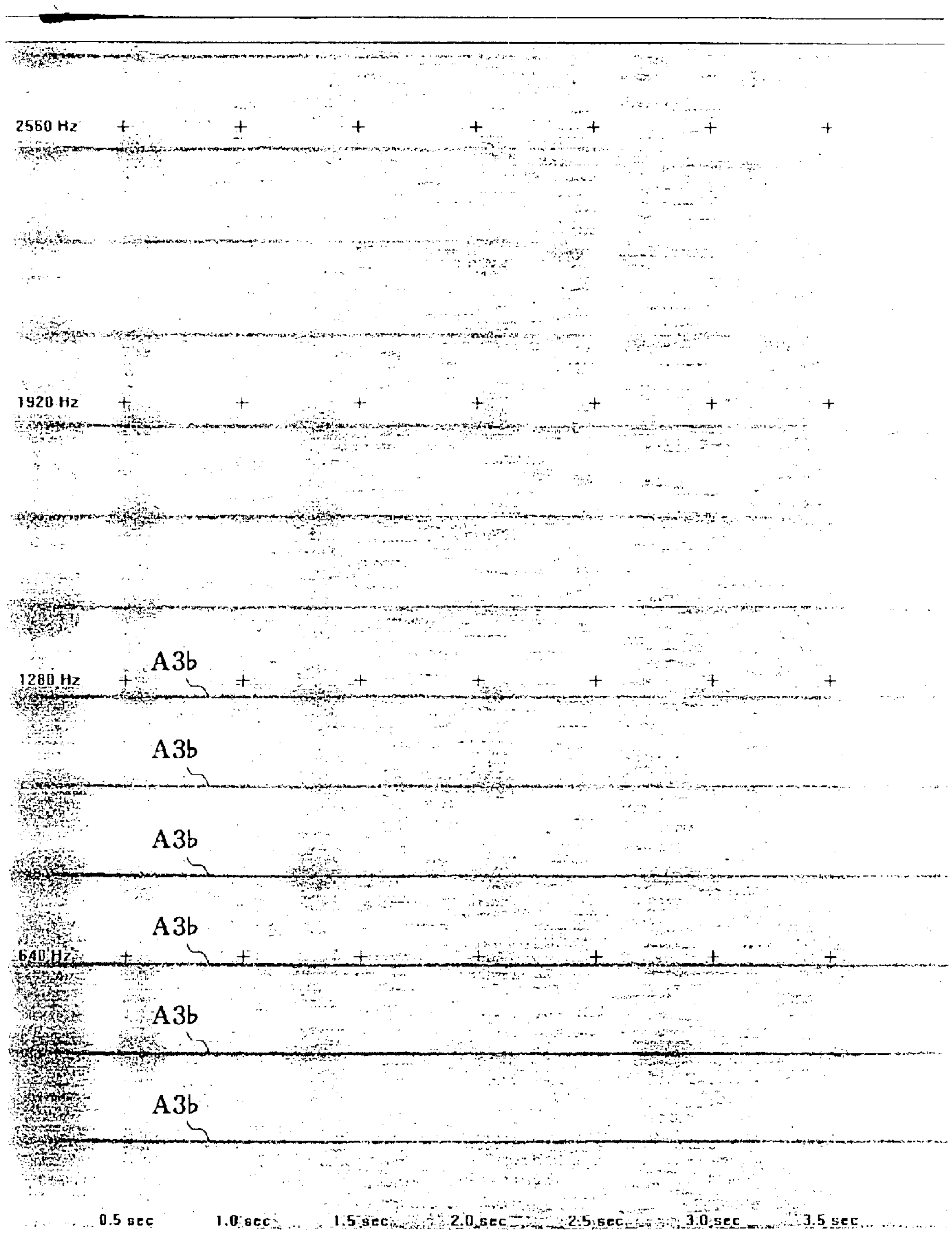
Figure 13D:
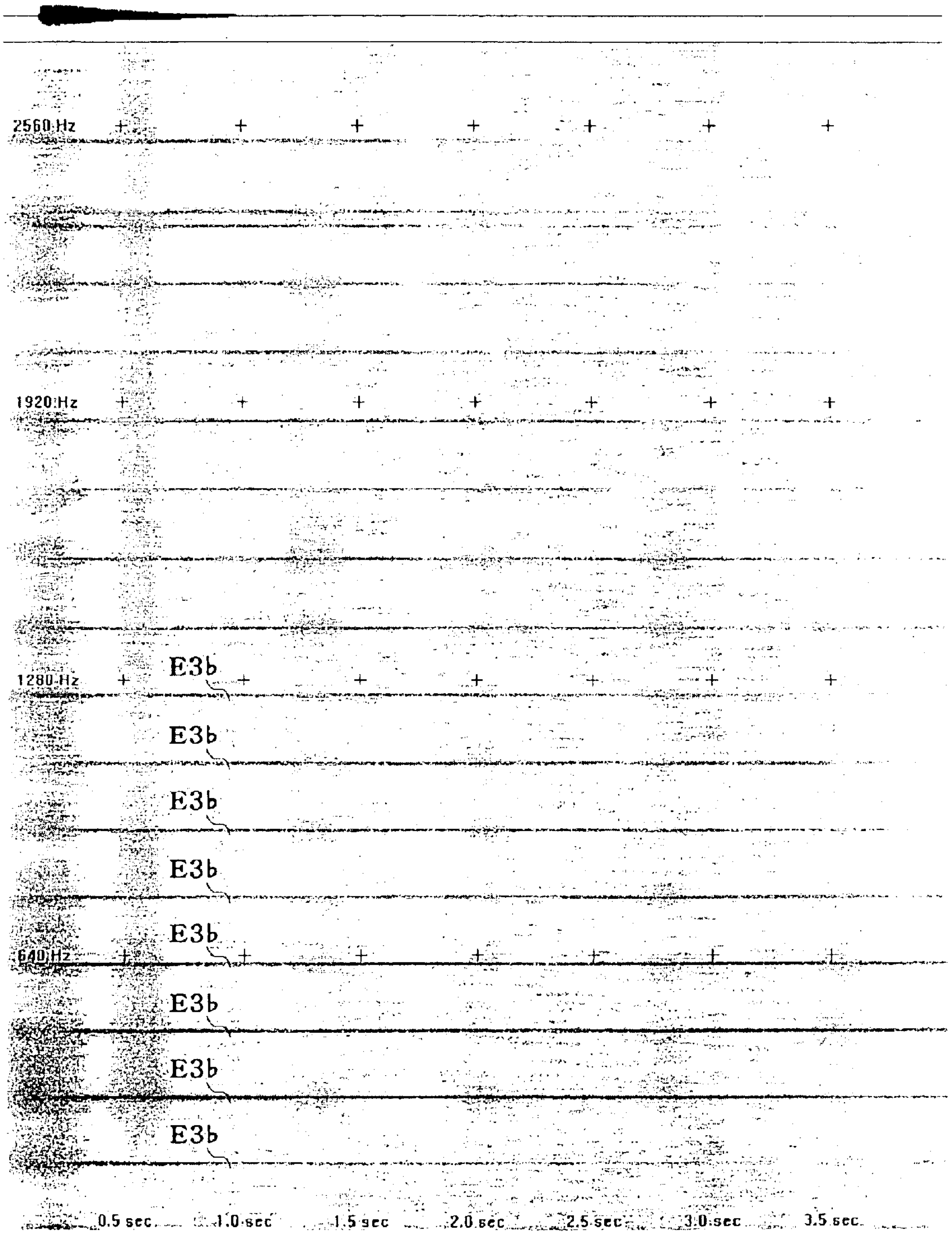
Figure 13E:
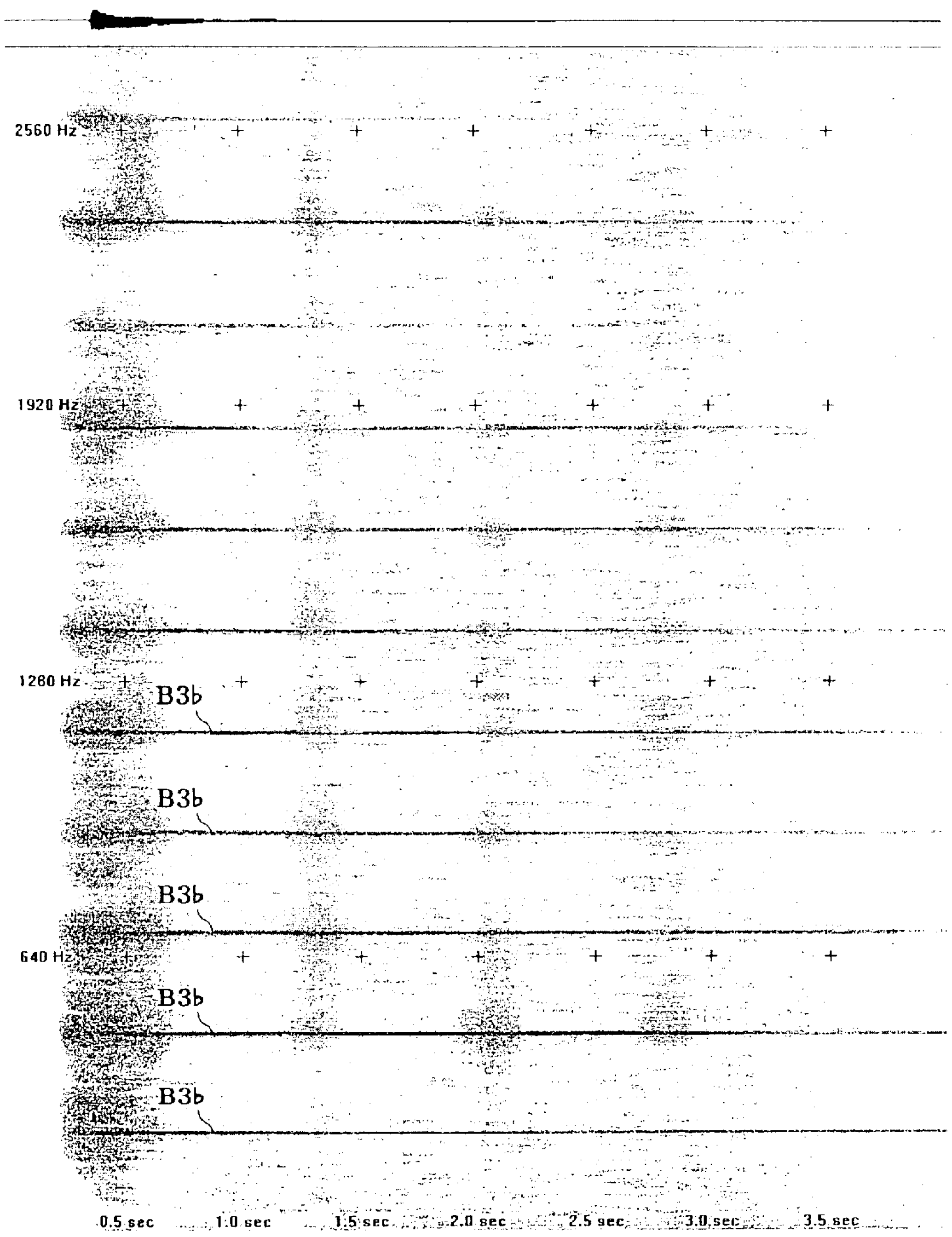
Figure 13F:
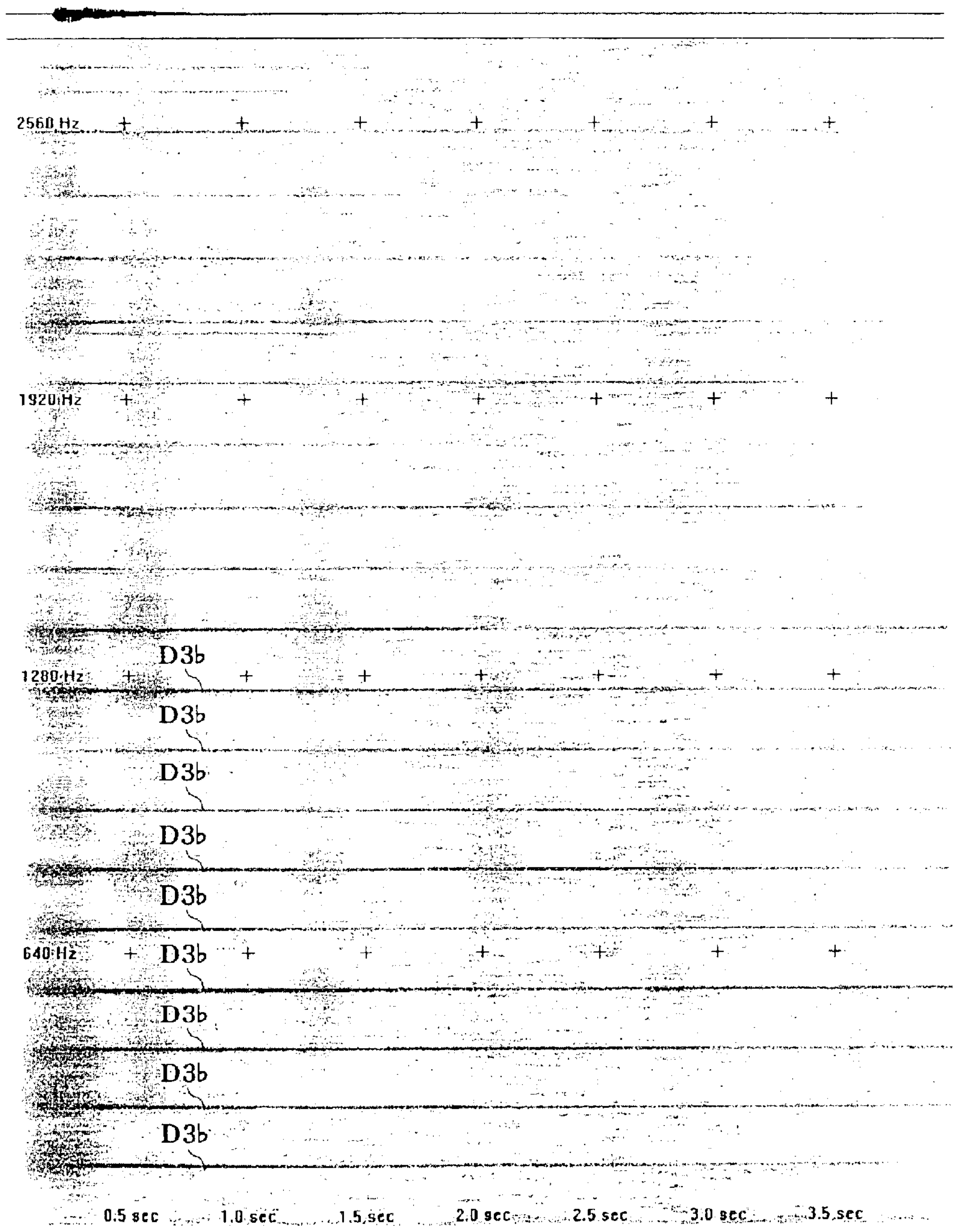
Figure 13G:
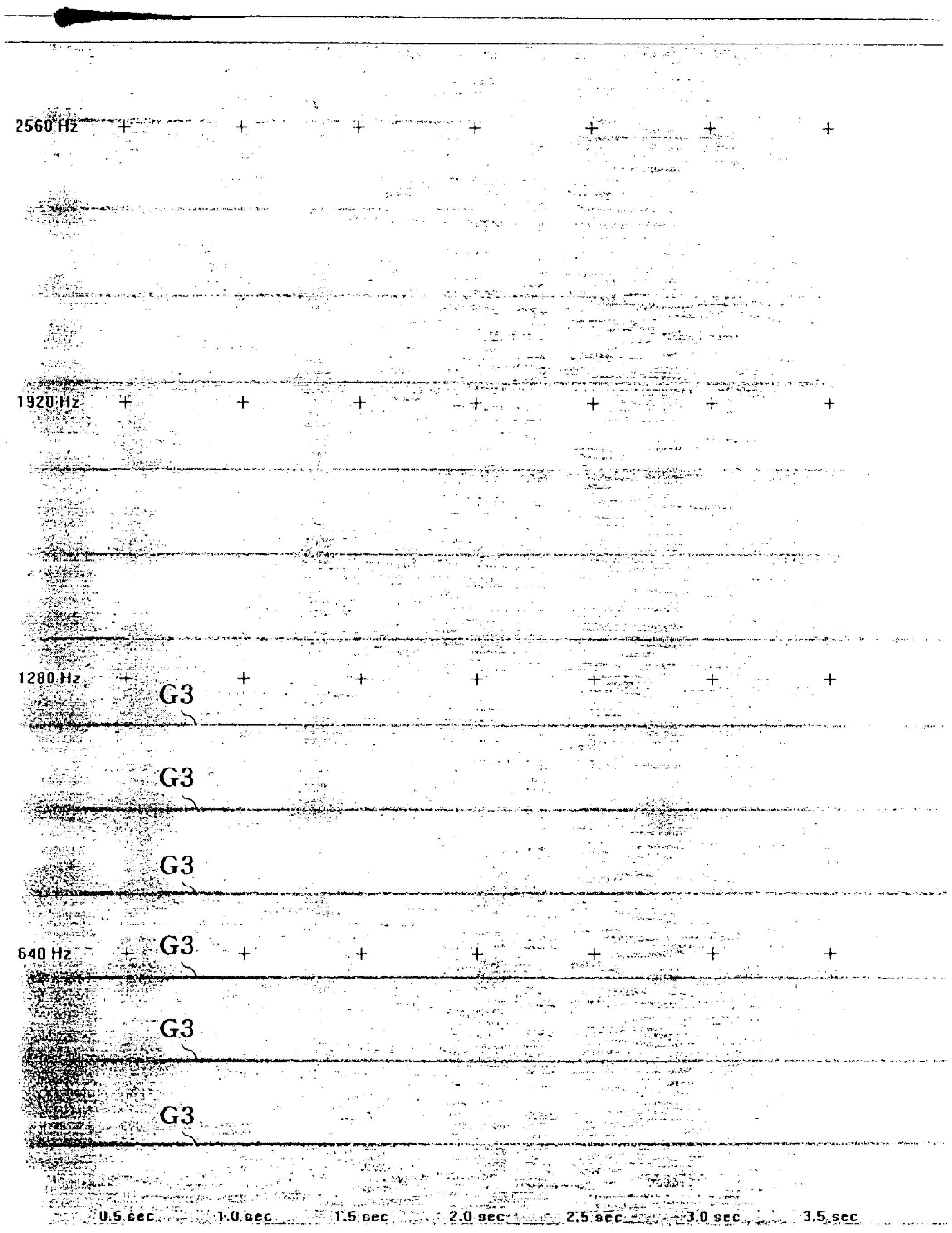
Figure 14B:
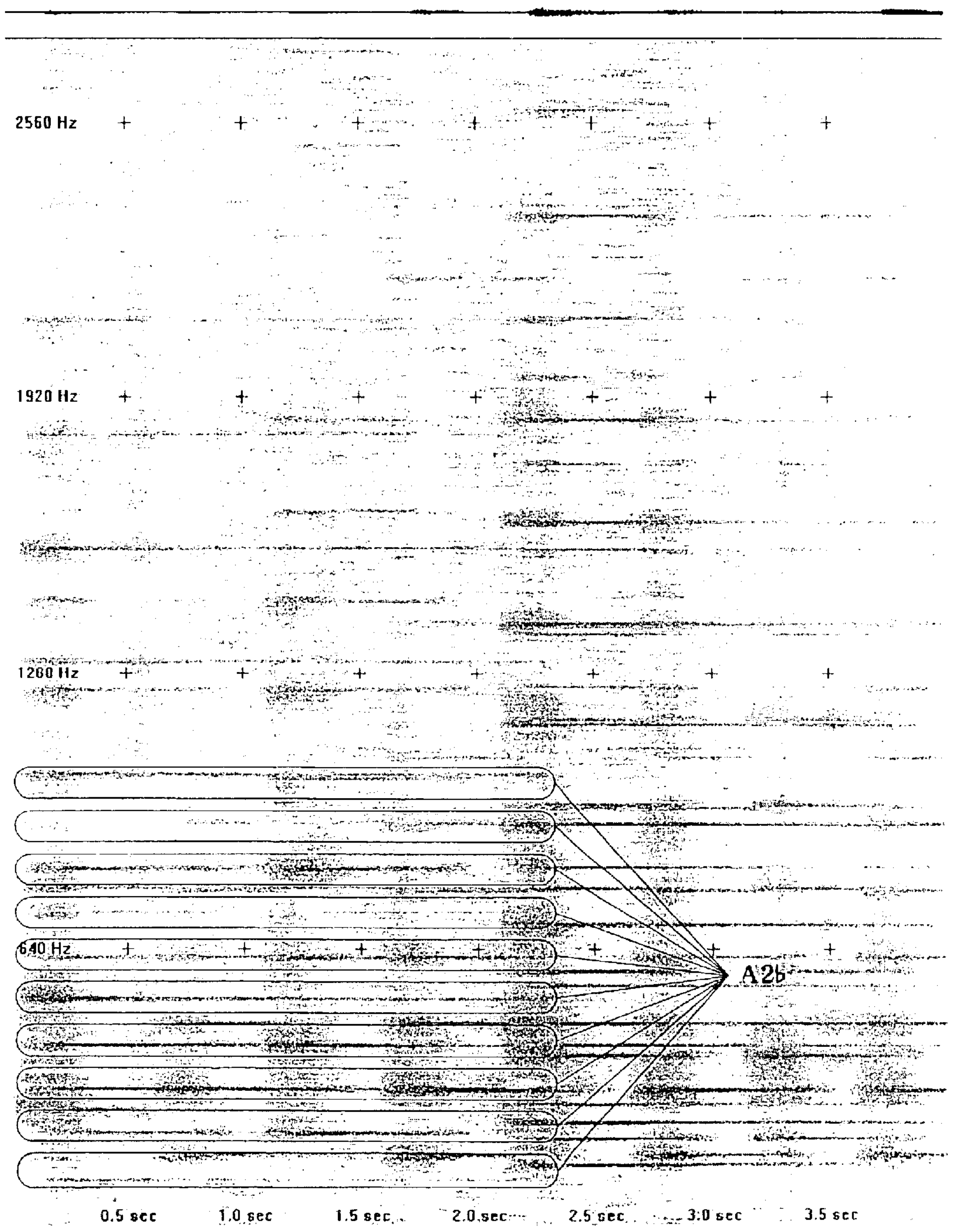

FIG. 14B shows the frequency-components of the note A2♭ shown in FIG. 13B indicated on FIG. 12. Since the strength of the note A2♭ shown in FIG. 13B is greater than that shown in FIG. 12, the pitch-frequency and harmonic-frequencies of the note A2♭ are clearly shown in FIG. 13B but vaguely shown in FIG. 12, and particularly, higher harmonic-frequencies are barely shown in the upper portion of FIG. 12. If the frequency-magnitudes of FIG. 13B are lowered to match the magnitude of the pitch-frequency of the note A2♭ shown in FIG. 12 and compared with those of FIG. 12, it can be seen that the frequency-components of the note A2♭ are included in FIG. 12, as shown in FIG. 14B. In FIG. 14B, the $5^{th}$ harmonic-frequency-component of the note A2♭ is strong because it overlaps with the $2^{nd}$ harmonic-frequency-component of the note C4. That is, because the $5^{th}$ harmonic-frequency of the note A2♭ is 519 Hz and the $2^{nd}$ harmonic-frequency of the note C4 is 523 Hz, they overlap in the same frequency range in FIG. 14B. In addition, referring to FIG. 14, the ranges of $5^{th}$, $10^{th}$, and $15^{th}$ harmonic-frequencies of the note A2♭ respectively overlap with the ranges of the $2^{nd}$, $4^{th}$, and $6^{th}$ harmonic-frequencies of the note C4, so the corresponding harmonic-frequencies show stronger than in FIG. 13B. (Here, considering the fact that weak sound is vaguely illustrated on a spectrogram, the sounds of individual notes were recorded at greater strengths than the actual performance as shown in FIG. 12 to obtain FIGS. 13A through 13G so that frequency-components could be clearly distinguished from one another visually.)

Figure 14C:
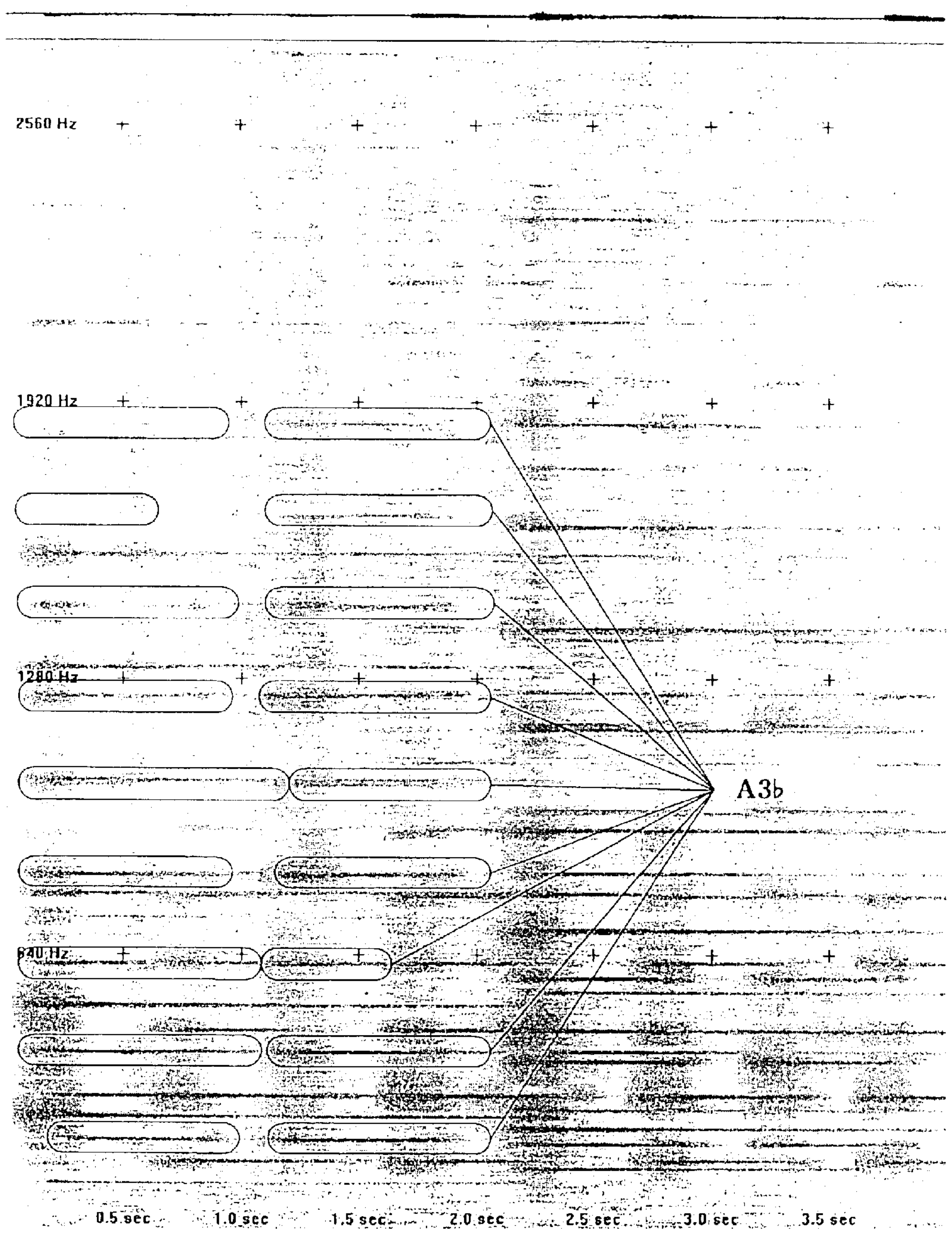

FIG. 14C shows the frequency-components of the note A3♭ shown in FIG. 13C indicated on FIG. 12. Since the strength of the note A3♭ shown in FIG. 13C is greater than that shown in FIG. 12, the frequency-components shown in FIG. 13C are expressed as stronger than in FIG. 14C. Unlike the above-described notes, it is not easy to find only the components of the note A3♭ in FIG. 14C because a lot of portions of the frequency-components of the note A3♭ overlap with the pitch and harmonic-frequency-components of other notes and the note A3♭ was weakly performed for a while and disappeared while other notes were continuously performed. All of the frequency-components of the note A3♭ overlap with harmonic-frequencies of the note A2♭ of multiples of 2. In addition, the $5^{th}$ harmonic-frequency of the note A3♭ overlaps with the $4^{th}$ harmonic-frequency of the note C4, so it is difficult to identify a discontinued portion between two portions of the note A3♭ separately performed two times while the note C4 was continuously performed. Nevertheless, other frequency-components become weaker in the middle, so the harmonic-frequency-components of the note A2♭ and the discontinued portion of the note A3♭ can be identified.

Figure 14D:
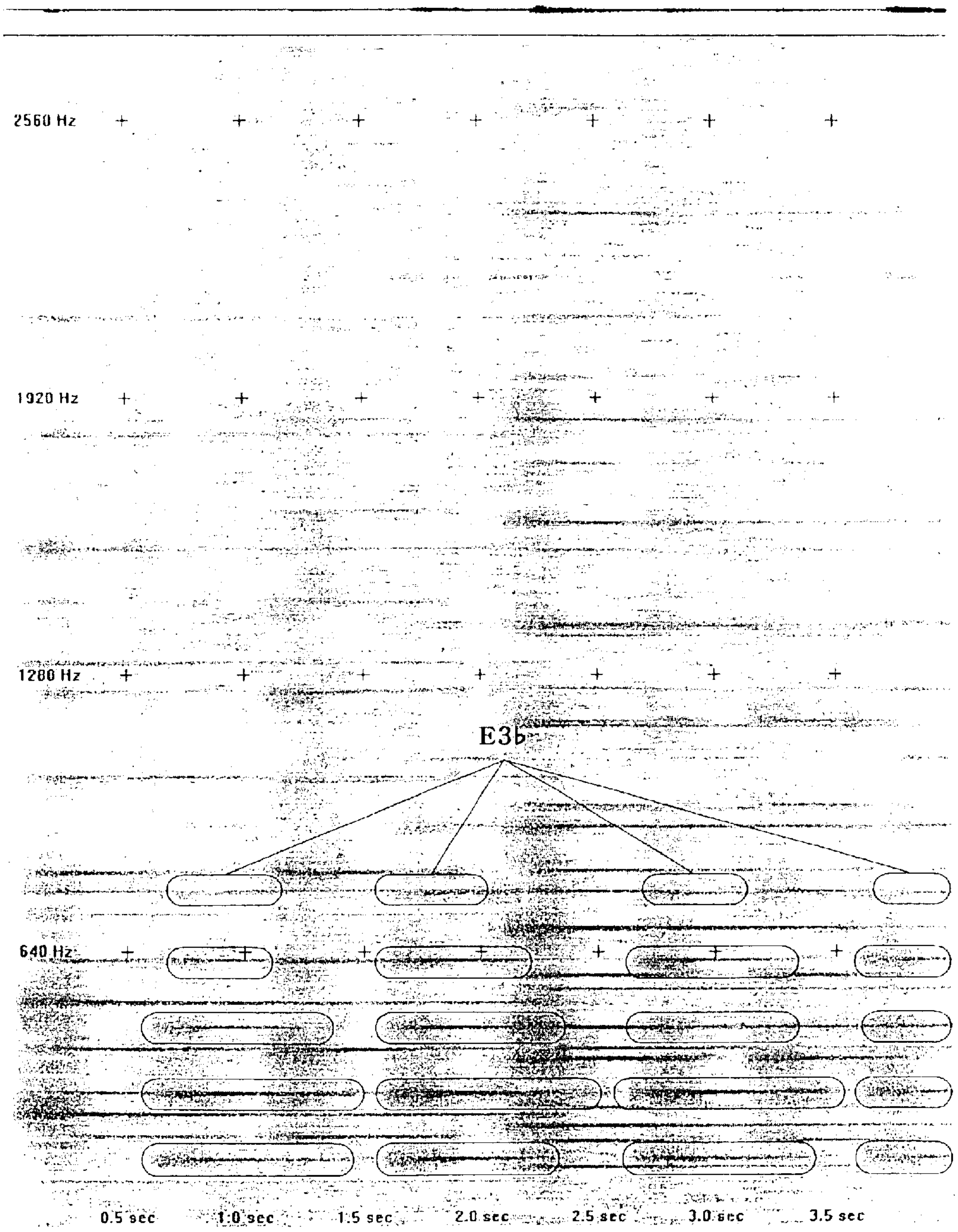

FIG. 14D shows the frequency-components of the note E3♭ shown in FIG. 13D indicated on FIG. 12. Since the strength of the note E3♭ shown in FIG. 13D is greater than that shown in FIG. 12, the frequency-components shown in FIG. 13D are expressed as stronger than in FIG. 14D. The note E3♭ was separately performed four times. For the time during which the note E3♭ was performed first two times, the $2^{nd}$ and $4^{th}$ harmonic-frequency-components of the note E3♭ overlap with the $3^{rd}$ and $6^{th}$ harmonic-frequency-components of the note A2♭, so harmonic-frequency-components of the note A2♭ show in the discontinued portion between the separate two portions of the note E3♭ performed separately. In addition, the $5^{th}$ harmonic-frequency-component of the note E3♭ overlaps with the $3^{rd}$ harmonic-frequency-component of the note C4, so the frequency-components of the note E3♭ are continued in the discontinued portion in the actual performance. For the time during which the note E3♭ was performed next two times, the $3^{rd}$ harmonic-frequency-component of the note E3♭ overlaps with the $2^{nd}$ harmonic-frequency-component of the note B3♭, so the frequency-component of the note E3♭ shows even while the note E3♭ is not actually performed. In addition, the $5^{th}$ harmonic-frequency-component of the note E3♭ overlaps with the $4^{th}$ harmonic-frequency-component of the note G3, so the $4^{th}$ harmonic-frequency-component of the notes G3 and the $5^{th}$ harmonic-frequency-component of the note E3♭ are continued even if the notes G3 and E3♭ were alternately performed.

Figure 14E:
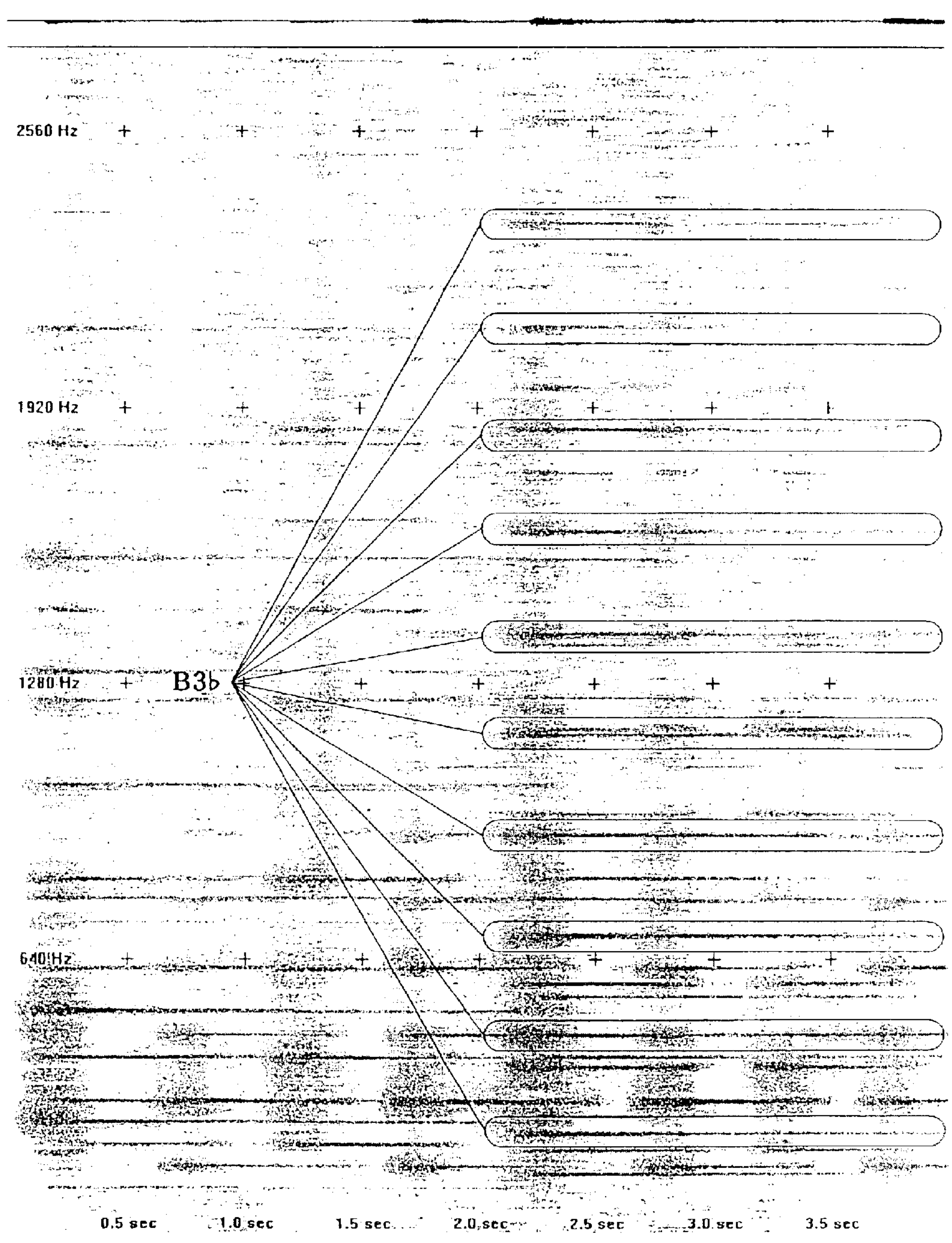

FIG. 14E shows the frequency-components of the note B3♭ shown in FIG. 13E indicated on FIG. 12. Since the strength of the note B3♭ shown in FIG. 13D is a little greater than that shown in FIG. 12, the frequency-components shown in FIG. 13E are expressed as stronger than in FIG. 14E. However, the frequency-components of the note B3♭ shown in FIG. 13E almost match those in FIG. 14E. As shown in FIG. 13E, harmonic-frequencies of the note B3♭ shown in the upper portion of FIG. 13E become very weak showing vaguely, as the sound of the note B3♭ becomes weaker. Similarly, in FIG. 14E, harmonic-frequencies shown in the upper portion become weaker toward the right end.

Figure 14F:
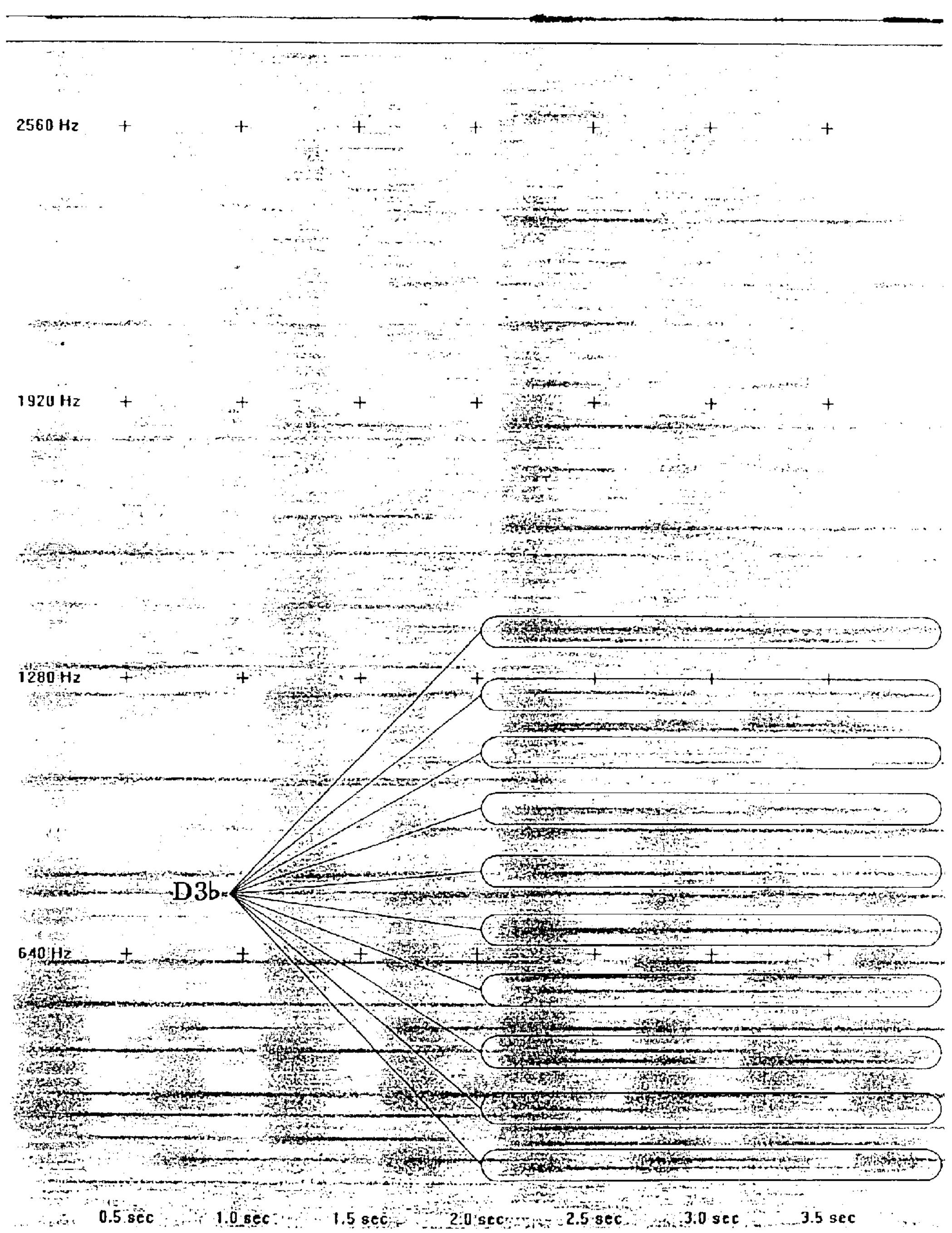

FIG. 14F shows the frequency-components of the note D3♭ shown in FIG. 13F indicated on FIG. 12. Since the strength of the note D3♭ shown in FIG. 13F is greater than that shown in FIG. 12, the frequency-components shown in FIG. 13F are expressed as stronger than in FIG. 14F. However, the frequency-components of the note D3♭ shown in FIG. 13F almost match those in FIG. 14F. Particularly, like FIG. 13F in which the $9^{th}$ harmonic-frequency of the note D3♭ is weaker than the $10^{th}$ harmonic-frequency of the note D3♭, the $9^{th}$ harmonic-frequency of the note D3♭ is very weak and weaker than the $10^{th}$ harmonic-frequency of the note D3♭ in FIG. 14F. However, since the $5^{th}$ and $10^{th}$ harmonic-frequencies of the note D3♭ shown in FIG. 14F overlap with the $3^{rd}$ and $6^{th}$ harmonic-frequencies of the note B3♭ shown in FIG. 14E, the $5^{th}$ and $10^{th}$ harmonic-frequencies of the note D3♭ show stronger than the other harmonic-frequencies of the note D3♭. Since the $5^{th}$ harmonic-frequency of the note D3♭ is 693 Hz, and the $3^{rd}$ harmonic-frequency of the note B3♭ is very close to 699 Hz, they overlap in a spectrogram.

Figure 14G:
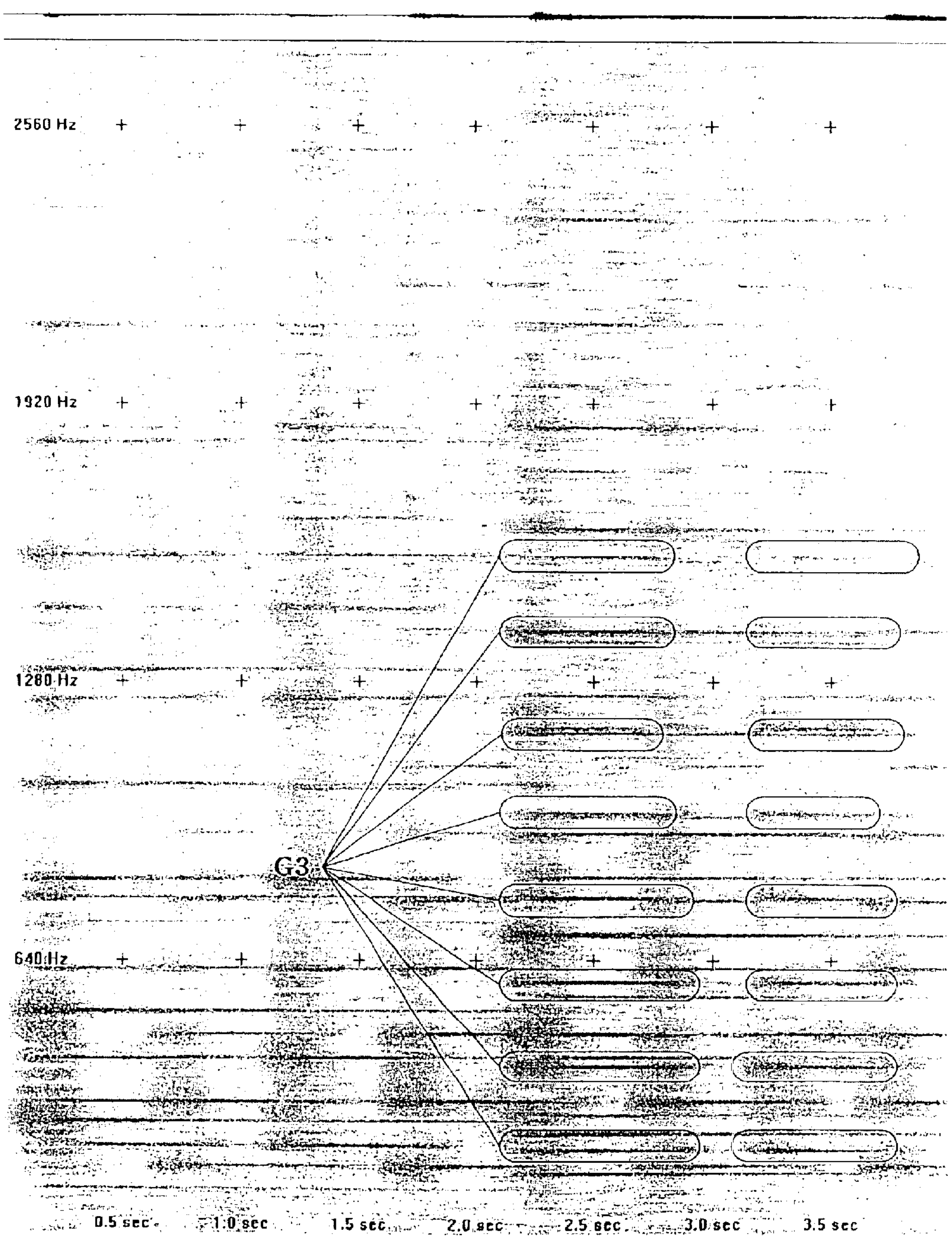

FIG. 14G shows the frequency-components of the note G3 shown in FIG. 13G indicated on FIG. 12. Since the strength of the note G3 shown in FIG. 13G is a little greater than that shown in FIG. 12, the frequency-components shown in FIG. 13G are expressed as stronger than in FIG. 14G. Since the note G3 shown in FIG. 14G was performed stronger than the note A3♭ shown in FIG. 14C, each of the frequency-components of the note G3 could be found clearly. In addition, unlike FIGS. 14C and 14F, the frequency-components of the note G3 rarely overlap with frequency-components of the other notes, so each of the frequency-components of the note G3 can be visually identified easily. However, although the $4^{th}$ harmonic-frequency of the note G3 and the $5^{th}$ harmonic-frequency of the note E3♭ shown in FIG. 14D are similar at 784 Hz and 778 Hz, respectively, since the notes E3♭ and G3 are performed at different time points, the $5^{th}$ harmonic-frequency-component of the note E3♭ shows a little below a portion between two separate portions of the $4^{th}$ harmonic-frequency-component of the note G3.

Figure 15:
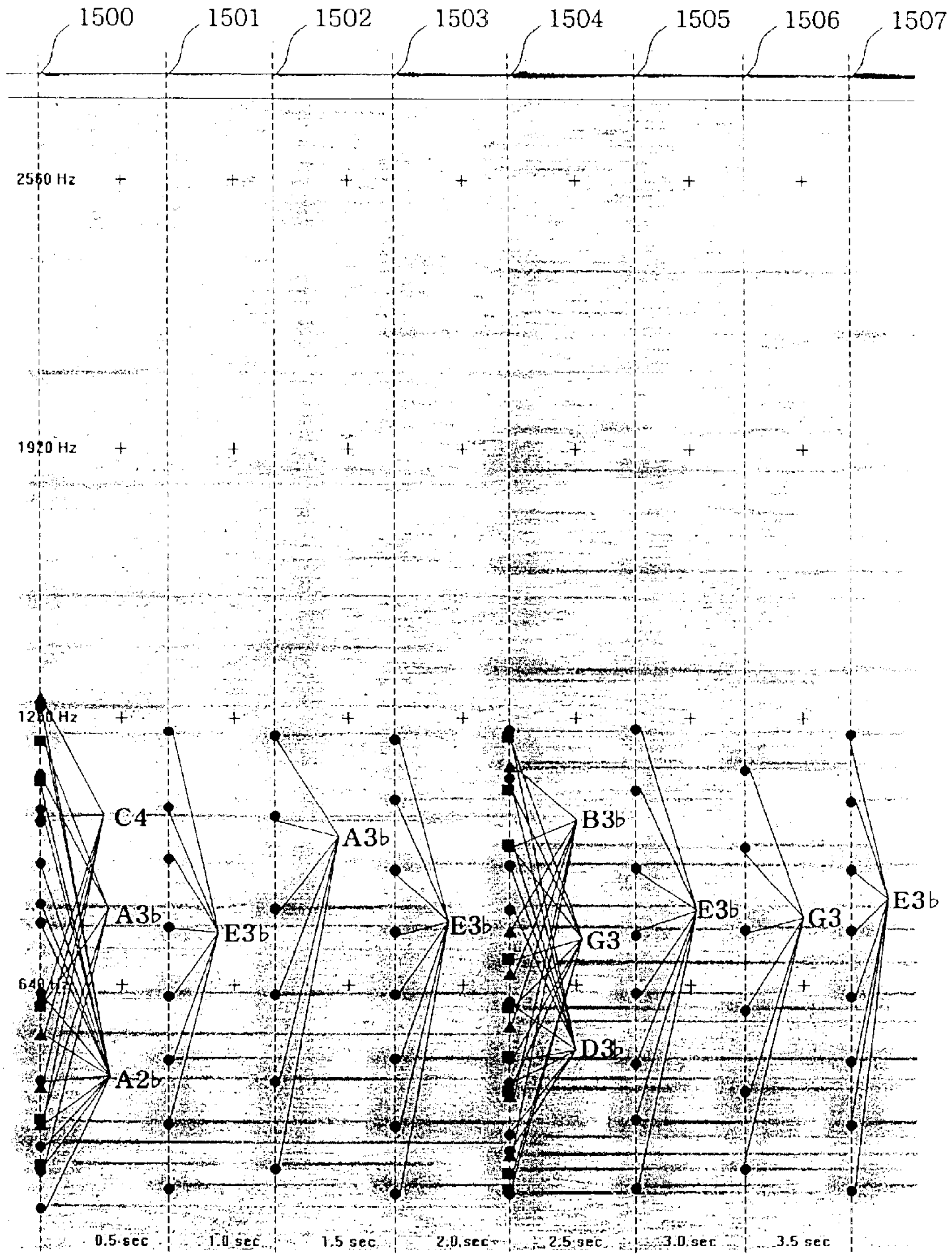
FIG. 15 is a diagram in which the frequency-components shown in FIG. 12 are compared with the frequency-components of the notes contained in the score of FIG. 2.

FIG. 15 is a diagram in which the frequencies shown in FIG. 12 are compared with the frequency-components of the individual notes contained in the score of FIG. 2. In other words, the results of analyzing the frequency-components shown in FIG. 12 are displayed in FIG. 15 so that the results can be understood at one sight. In the above-described method for analyzing music according to the present invention, the frequency-components of the individual notes shown in FIGS. 13A through 13G are used to analyze the frequency-components shown in FIG. 12. As a result, FIG. 15 can be obtained. A method of analyzing input digital-sounds using sound-information of musical-instrument according to the present invention can be summarized through FIG. 15. In other words, in the above-described method of the present invention, the sounds of individual notes actually performed are received, and the frequency-components of the received sounds are used as sound-information of musical-instrument.

It has been described that frequency-components are analyzed using FFT. However, it is apparent that wavelet or other techniques developed from digital signal processing algorithms instead of FFT can be used to analyze frequency-components. In other words, a most representative Fourier transform technique is used in descriptive sense only, and the present invention is not restricted thereto.

Meanwhile, in FIGS. 14A through 15, time-information of frequency-components of the notes is different from that of actual performance. Particularly, in FIG. 15, the notes start at 1500, 1501, 1502, 1503, 1504, 1505, 1506, and 1507 in the actual performance, but their frequency-components show before the start-points. Moreover, the frequency-components show after end-points of the actually performed notes. These timing-errors occur because the size of an FFT window is set to 8192 in order to accurately analyze frequency-components according to the flow of time. The range of timing-errors depends on the size of an FFT window. In the above embodiment, the sampling rate is 22050 Hz, and the FFT window is 8192 samples, so an error is 8192÷22050≈0.37 seconds. In other words, when the size of the FFT window increases, the size of a unit frame also increases, thereby decreasing a gap between identifiable frequencies. As a result, frequency-components can be accurately analyzed according to the pitches, but timing-errors increase. When the size of the FFT window decreases, a gap between identifiable frequencies increases. As a result, notes close to each other in a low frequency range cannot be distinguished from one another, but timing errors decrease. Alternatively, increasing the sampling rate can decrease the range of timing-errors.

FIGS. 16A through 16D are diagrams of the results of analyzing notes performed according to the first measure of the score shown in FIGS. 1 and 2 using FFT windows of different sizes in order to explain changes in timing-errors according to changes in the size of an FFT window.

Figure 16A:
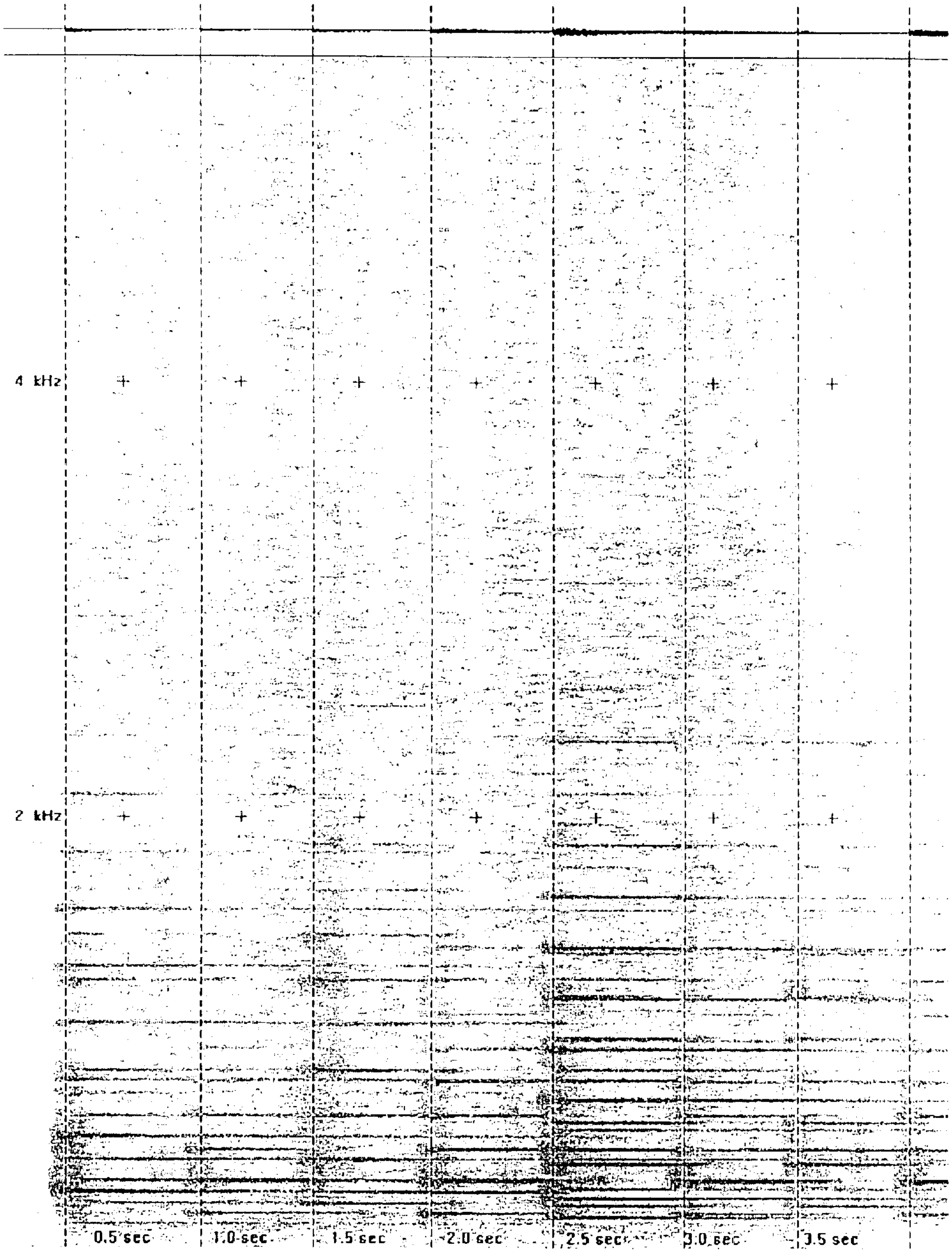
FIGS. 16A through 16D are diagrams of the results of analyzing the frequency-components of the notes, which are performed according to the first measure of the score shown in FIGS. 1 and 2, by performing fast Fourier transform (FFT) using FFT windows of different sizes.
Figure 16B:
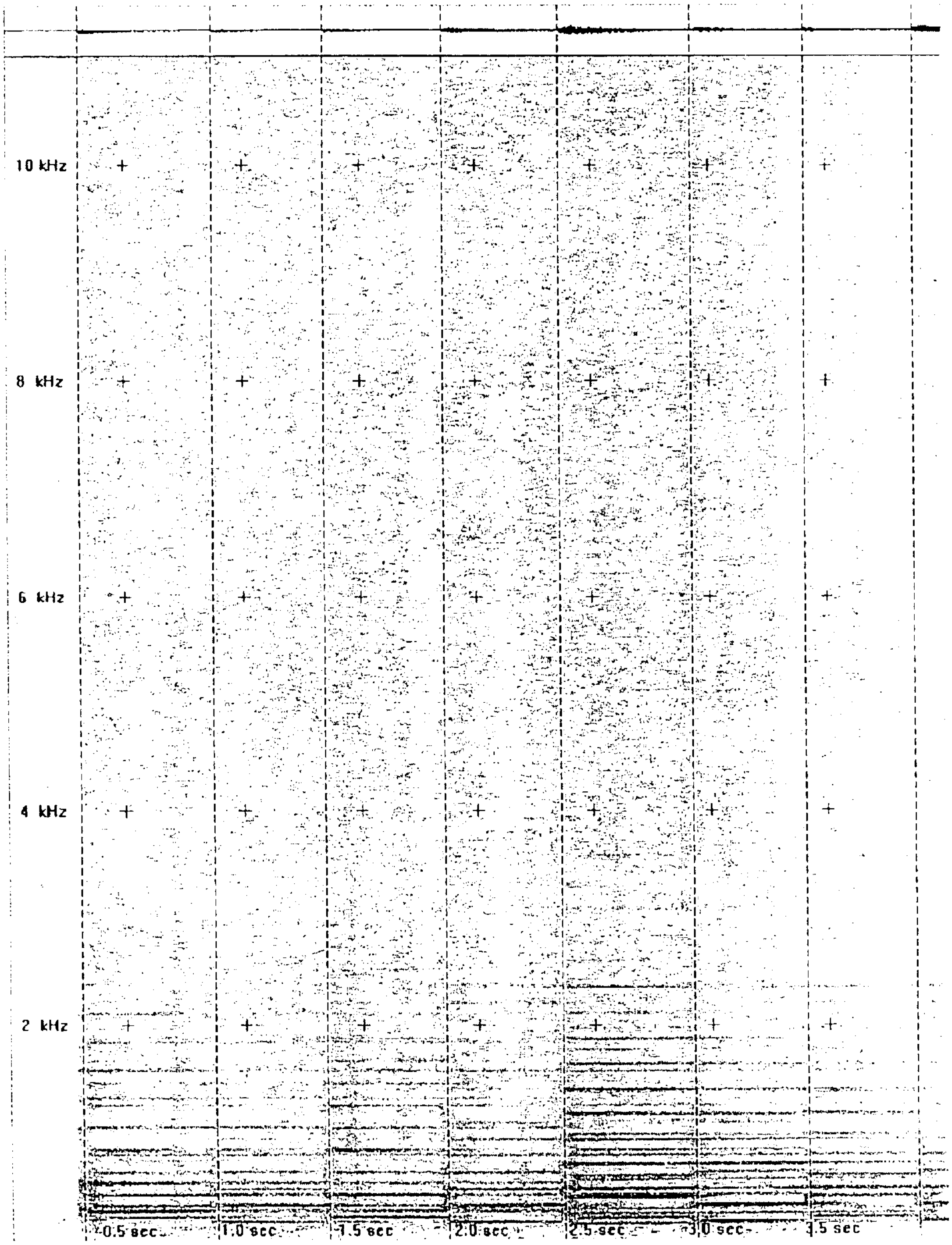
Figure 16C:
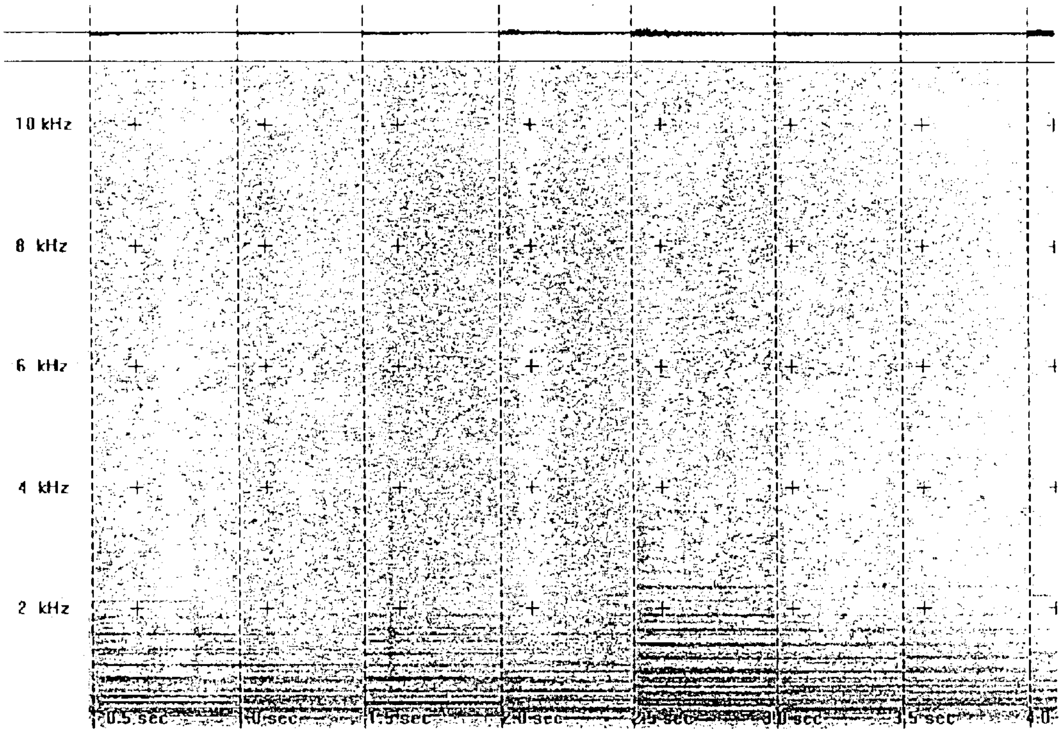
Figure 16D:
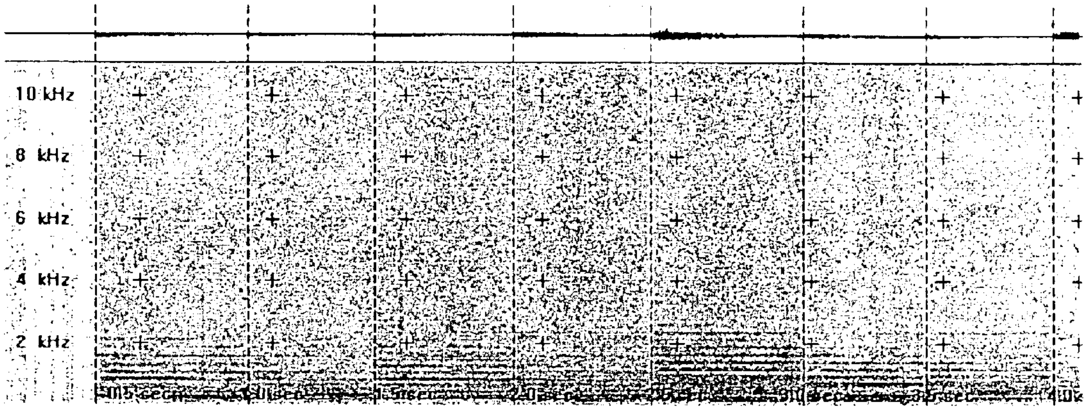

FIG. 16A shows the result of analysis in the case where the size of an FFT window is set to 4096 for FFT. FIG. 16B shows the result of analysis in the case where the size of an FFT window is set to 2048 for FFT. FIG. 16C shows the result of analysis in the case where the size of an FFT window is set to 1024 for FFT. FIG. 16D shows the result of analysis in the case where the size of an FFT window is set to 512 for FFT.

Meanwhile, FIG. 15 shows the result of analysis in the case where the size of an FFT window is set to 8192 for FFT. Accordingly, by comparing the results shown in FIGS. 15 through 16D, it can be inferred that a gap between identifiable frequencies becomes narrower to thus allow fine analysis but a timing-error increases when the size of an FFT window increases, whereas a gap between identifiable frequencies becomes wider to thus make it difficult to perform fine analysis but a timing-error decreases when the size of an FFT window decreases.

Therefore, when analysis is performed, the size of an FFT window can be changed according to required time accuracy and required frequency accuracy. Alternatively, time-information and frequency-information can be analyzed using FFT windows of different sizes.

Figure 17A:
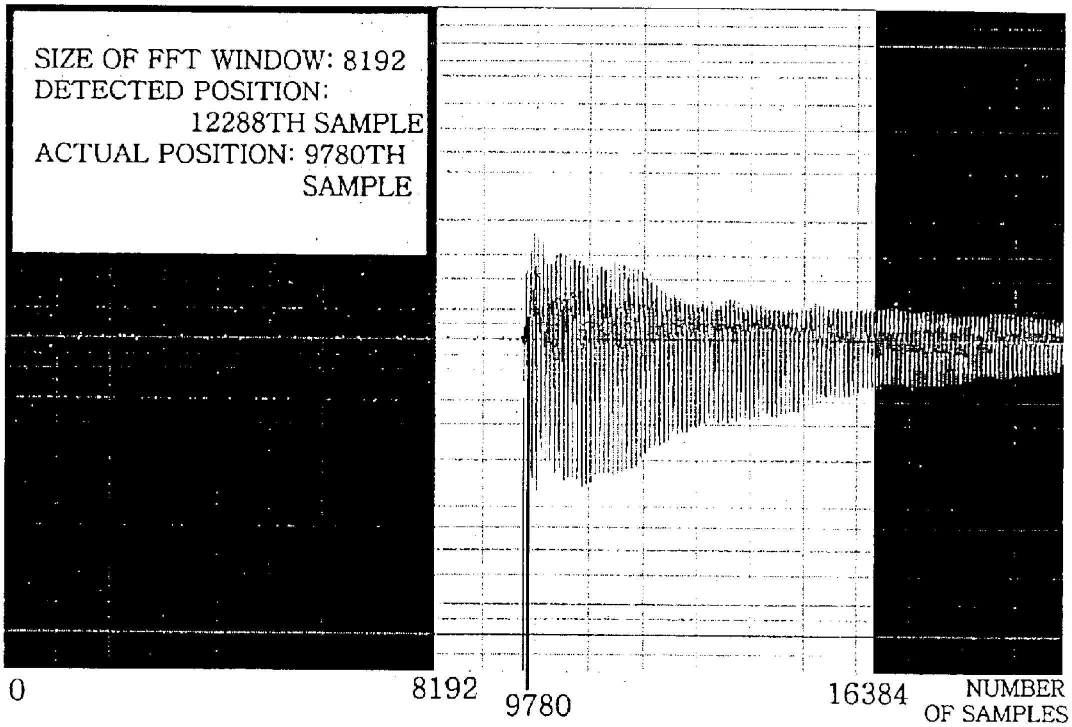
FIGS. 17A and 17B are diagrams showing time-errors occurring during analysis of digital-sounds, which errors vary with the size of an FFT window.
Figure 17B:
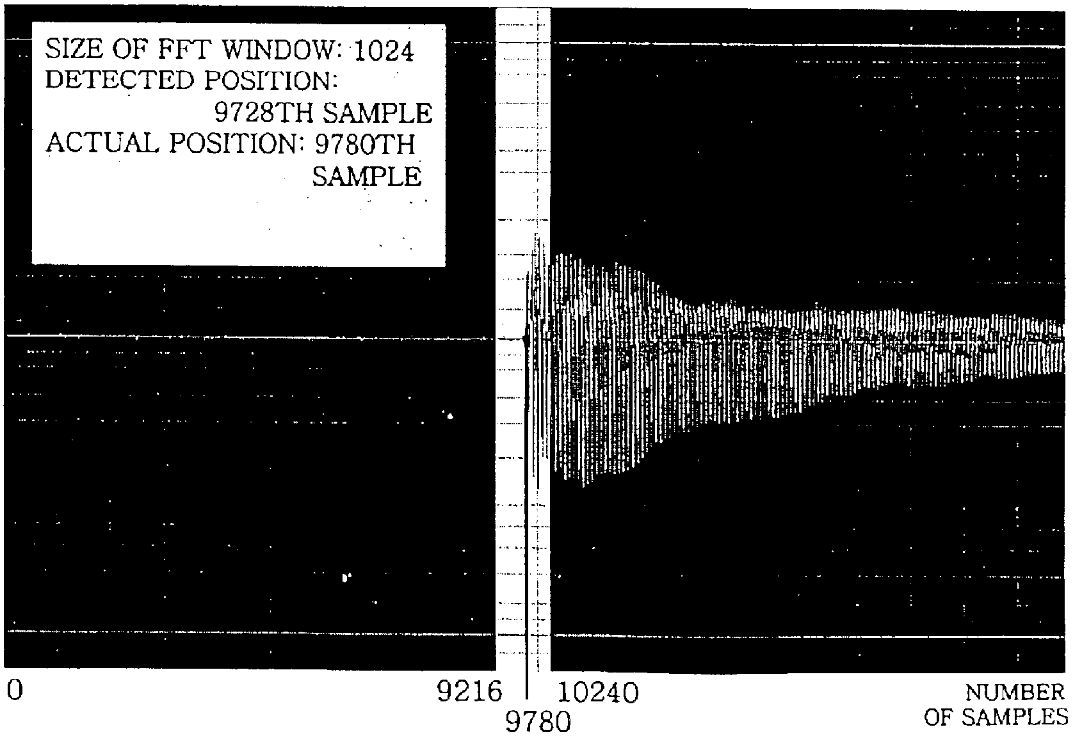

FIGS. 17A and 17B show timing errors occurring during analysis of digital-sounds, which vary with the size of an FFT window. Here, a white area corresponds to an FFT window in which a particular note is found. In FIG. 17A, the size of an FFT window is large at 8192, so a white area corresponding to a window in which the particular note is found is wide. In FIG. 17B, the size of an FFT window is small at 1024, so a white area corresponding to a window in which the particular note is found is narrow.

FIG. 17A is a diagram of the result of analyzing digital-sounds when the size of an FFT window is set to 8192. Referring to FIG. 17A, the note actually starts at a point 9780, but the note starts at a point 12288 (=(8192+16384)/2) in the middle of the window in which the particular note is found according to the result of FFT. Here, there occurs an error of a time corresponding to 2508 samples, i.e., a difference between a 12288th sample and a 9780th sample. In other words, in the case of sampling rate 22.5 KHz, an error of about 2508*(1/22500)=0.11 seconds occurs.

FIG. 17B is a diagram of the result of analyzing digital-sounds when the size of an FFT window is set to 1024. Referring to FIG. 17B, like FIG. 17A, the note actually starts at a point 9780, but the note starts at a point 9728 (=(9216+10240)/2) according to the result of FFT. Here, it is determined that the note starts at a time point corresponding to a 9728th sample in the middle of the range between a 9216th sample and a 10239th sample. An error is only a time corresponding to 52 samples. In the case of sampling rate 22.5 KHz, the error of about 0.002 seconds occurs according to the above-described calculation method. Therefore, it can be inferred that the more accurate result of analysis can be obtained as the size of an FFT window decreases.

Figure 18:
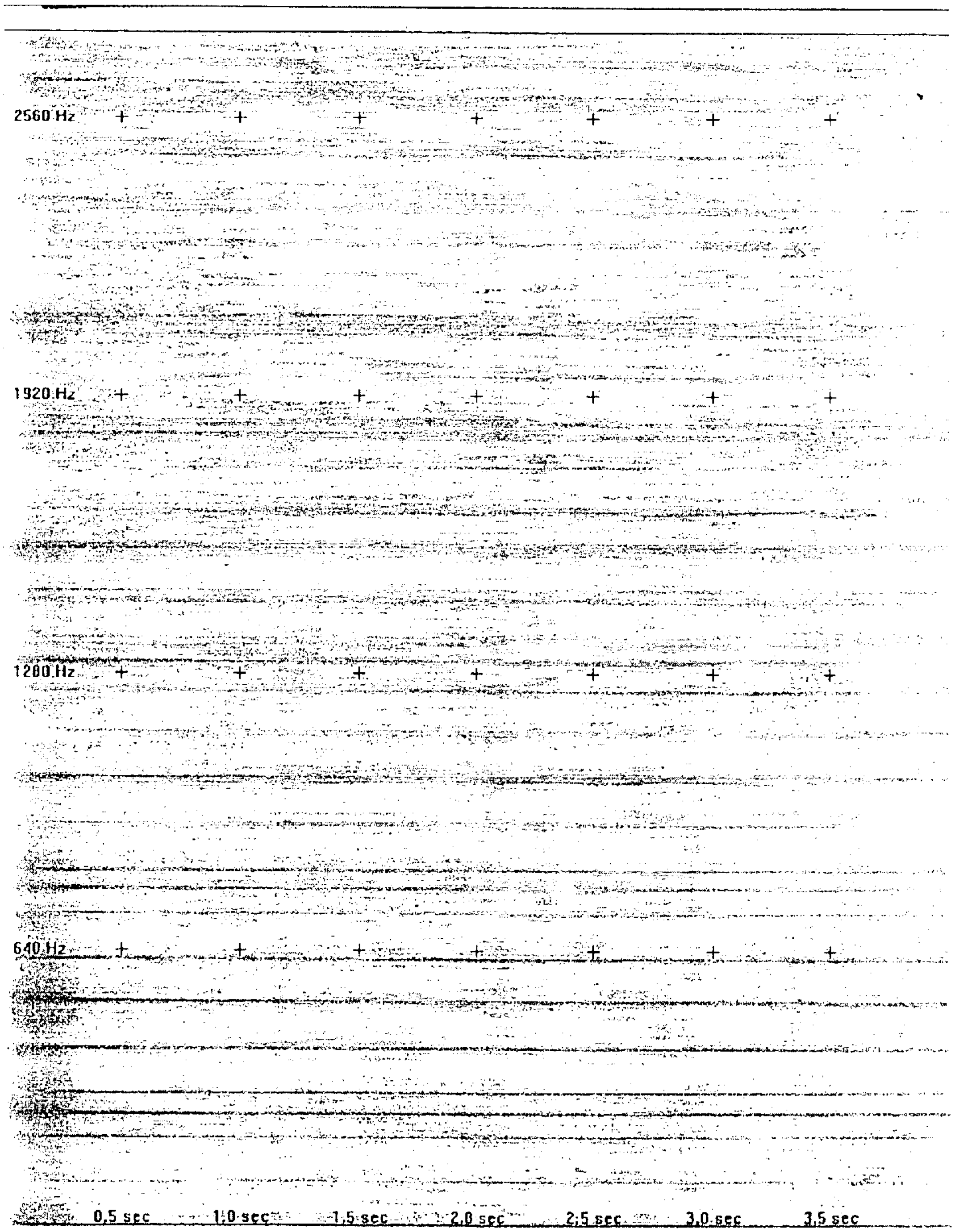
FIG. 18 is a diagram of the result of analyzing the frequency-components of the sound obtained by synthesizing a plurality of pieces of monophonic-pitches-information detected using sound-information and/or score-information according to the present invention.

FIG. 18 is a diagram of the result of analyzing the frequency-components of the sounds obtained by putting together a plurality of pieces of individual pitches detected using the sound-information and the score-information according to the second embodiment of the present invention. In other words, the score-information is detected form the score shown in FIG. 1, and the sound-information described with reference to FIGS. 13A through 13G are used.

More specifically, it is detected from the score-information detected from the score of FIG. 1 that the notes C4, A3♭, and A2♭ are initially performed for 0.5 seconds. Sound information of the notes C4, A3♭, and A2♭ is detected from the information shown in FIGS. 13A through 13C. Input digital-sounds are analyzed using the selected score-information and the selected sound-information. The result of analysis is shown in FIG. 18. Here, it can be found that a portion of FIG. 12 corresponding to the initial 0.5 seconds is almost the same as the corresponding portion of FIG. 14D. Accordingly, the portion of FIG. 18 corresponding to the initial 0.5 seconds, which corresponds to (result) or (performance) in Pseudo-code 2, is the same as the portion of FIG. 12 corresponding to the initial 0.5 seconds.

While this invention has been particularly shown and described with reference to preferred embodiments thereof, it will be understood by those skilled in the art that various changes may be made within the scope which does not beyond the essential characteristics of this invention. The above embodiments have been used in a descriptive sense only and not for purpose of limitation. Therefore, it will be understood that the scope of the invention will be defined by the appended claims.

INDUSTRIAL APPLICABILITY

According to the present invention, input digital-sounds can be quickly analyzed using sound-information or both sound-information and score-information. In conventional methods for analyzing digital-sounds, music composed of polyphonic-pitches, for example, piano music, cannot be analyzed. However, according to the present invention, as well as monophonic-pitches, polyphonic-pitches contained in digital-sounds can be quickly and accurately analyzed using sound-information or both sound-information and score-information.

Accordingly, the result of analyzing digital-sounds according to the present invention can be directly applied to an electronic-score, and performance-information can be quantitatively detected using the result of analysis. This result of analysis can be widely used in from musical education for children to professional players' practice.

That is, by using a technique of the present invention allowing input digital-sounds to be analyzed in real time, positions of currently performed notes on an electronic-score are recognized in real time and positions of notes to be performed next are automatically indicated on the electronic-score, so that players can concentrate on performance without caring about turning over the leaves of a paper-score.

In addition, the present invention compares performance-information obtained as the result of analysis with previously stored score-information to detect performance accuracy so that players can be informed about wrong-performance. The detected performance accuracy can be used as data by which a player's performance is evaluated.

What is claimed is:

1. A method for analyzing digital-sounds using sound-information of musical-instruments, the method comprising the steps of:

(a) generating and storing sound-information of different musical instruments;

(b) selecting the sound-information of the particular instrument to be actually played from among the stored sound-information of different musical-instruments;

(c) receiving digital-sound-signals;

(d) decomposing the digital-sound-signals into frequency-components in units of frames;

(e) comparing the frequency-components of the digital-sound-signals with frequency-components of the selected sound-information of the particular instrument and analyzing the frequency-components of the digital-sound-signals to detect monophonic-pitches-information from the digital-sound-signals; and (f) outputting the detected monophonic-pitches-information.

2. The method of claim 1, wherein the step (e) comprises detecting time-information of each frame, comparing the frequency-components of the digital-sound-signals with the frequency-components of the selected sound-information of the particular instrument and analyzing the frequency-components of the digital-sound-signals in units of frames, and detecting pitch-information, strength-information, and time-information of each of individual pitches contained in each of the frames.

3. The method of claim 1 or 2, wherein the step (e) comprises the steps of:

(e1) selecting the lowest peak frequency-components contained in a current frame of the digital-sound-signals;

(e2) detecting the sound-information containing the lowest peak frequency-components from the selected sound-information of the particular instrument;

(e3) detecting, as monophonic-pitches-information, the sound-information containing most similar peak frequency-components to those of the current-frame from among the detected sound-information in step (e2);

(e4) removing the frequency-components of the sound-information detected as the monophonic-pitches-information in step (e3) from the current-frame; and (e5) repeating steps (e1) through (e4) when there are any peak frequency-components left in the current-frame.

4. The method of claim 2, wherein the step (e) further comprises determining whether the detected monophonic-pitches-information contains any new-pitch which is not included in a previous-frame, dividing a current-frame including the new-pitch into subframes if it is determined that the detected monophonic-pitches-information contains the new-pitch, finding a subframe including the new-pitch, and detecting pitch-information and strength-information of the new-pitch and time-information of the found subframe.

5. The method of claim 1, wherein the step (a) comprises periodically updating the sound-information of different musical instruments.

6. The method of claim 1, wherein the step (a) comprises storing each individual pitch which can be expressed by the sound-information in the form of wave data when storing the sound-information of different musical instruments in the form of samples of sounds having at least one strength, and extracting the frequency-components of the sound-information of different musical instruments from the wave data stored.

7. The method of claim 1, wherein the step (a) comprises storing each individual pitch which can be expressed by the sound-information in a form which can directly expressing the magnitudes of each frequency-components of the pitch when storing the sound-information of different musical instruments in the form of samples of sounds having at least one strength.

8. The method of claim 6 or 7, wherein the step (a) comprises separately storing sound-information of keyboard-instruments according to use/nonuse of pedals.

9. The method of claim 6 or 7, wherein the step (a) comprises separately storing sound-information of string-instruments by each string.

10. The method of claim 7, wherein the step (a) comprises performing Fourier transform on the sound-information of different musical instruments and storing the sound-information in a form in which the sound-information can be directly displayed.

11. The method of claim 7, wherein the step (a) comprises performing wavelet transform on the sound-information of different musical instruments and storing the sound-information in a form in which the sound-information can be directly displayed.

12. A method for analyzing digital-sounds using sound-information of musical-instruments and score-information, the method comprising the steps of:

(a) generating and storing sound-information of different musical instruments;

(b) generating and storing score-information of a score to be performed;

(c) selecting the sound-information of the particular instrument to be actually played and the score-information of the score to be actually performed from among the stored sound-information of different musical instruments and the stored score-information;

(d) receiving digital-sound-signals;

(e) decomposing the digital-sound-signals into frequency-components in units of frames;

(f) comparing the frequency-components of the digital-sound-signals with frequency-components of the selected sound-information of the particular instrument and the selected score-information, and analyzing the frequency-components of the digital-sound-signals to detect performance-error-information and monophonic-pitches-information from the digital-sound-signals; and (g) outputting the detected monophonic-pitches-information.

13. The method of claim 12, wherein the step (f) comprises detecting time-information of each-frame, comparing the frequency-components of the digital-sound-signals with the frequency-components of the selected sound-information of the particular instrument and the selected score-information, analyzing the frequency-components of the digital-sound-signals in units of frames, and detecting pitch-information, strength-information, and time-information of each of individual pitches contained in each of the frames.

14. The method of claim 12 or 13, wherein the step (f) further comprises determining whether the detected monophonic-pitches-information contains any new-pitch which is not included in a previous frame, dividing a current frame including a new-pitch into subframes if it is determined that the detected monophonic-pitches-information contains the new-pitch, finding a subframe including the new-pitch, and detecting pitch-information and strength-information of the new-pitch and time-information of the found subframe.

15. The method of claim 12 or 13, wherein the step (f) comprises the steps of:

(f1) generating expected-performance-values of the current-frame referring to the score-information in real time; and determining whether there is any note in the expected-performance-values which is not compared with the digital-sound-signals in the current-frame;

(f2) if it is determined that there is no note in the expected-performance-value which is not compared with the digital-sound-signals in the current-frame in step (f1), determining whether frequency-components of the digital-sound-signals in the current-frame correspond to performance-error-information, detecting performance-error-information and monophonic-pitches-information, and removing the frequency-components of the sound-information corresponding to the performance-error-information and the monophonic-pitches-information from the digital-sound-signals in the current-frame;

(f3) If it is determined that there is any note in the expected-performance-value which is not compared with the digital-sound-signals in the current-frame in step (f1), comparing the digital-sound-signals in the current-frame with the expected-performance-values and analyzing to detect monophonic-pitches-information from the digital-sound-signals in the current-frame, and removing the frequency-components of the sound-information detected as the monophonic-pitches-information from the digital-sound-signals in the current-frame; and (f4) repeating steps (f1) through (f4) when there are any peak frequency-components left in the current-frame of the digital-sound-signals.

16. The method of claim 15, wherein the step (f2) comprises the steps of:

(f2_1) selecting the lowest peak frequency-components contained in the current-frame of the digital-sound-signals;

(f2_2) detecting the sound-information containing the lowest peak frequency-components from the selected sound-information of the particular instrument;

(f2_3) detecting, as performance-error-information, the sound-information containing most similar peak frequency-components to peak frequency-components of the current-frame from the detected sound information;

(f2_4) if it is determined that the current pitches of the performance-error-information are contained in next notes in the score-information, adding the current pitches of the performance-error-information to the expected-performance-value and moving the current pitches of the performance-error-information into the monophonic-pitches-information; and (f2_5) removing the frequency-components of the sound-information detected as the performance-error-information or the monophonic-pitches-information from the digital-sounds in the current-frame.

17. The method of claim 16, wherein the step (f2_3) comprises detecting the pitch and strength of a corresponding performed note as the performance-error-information.

18. The method of claim 16, wherein the step (f3_3) comprises removing an expected-performance-value corresponding to the selected sound-information whose frequency-components are included in the digital-sound-signals at one or more time points but are not included in at least a predetermined number (N) of consecutive previous frames.

19. The method of claim 15, wherein the step (f3) comprises the steps of:

(f3_1) selecting the sound-information of the lowest peak frequency-components which is not compared with frequency-components contained in the current-frame of the digital-sound-signals from the sound-information corresponding to the expected-performance-value which has not undergone comparison;

(f3_2) if it is determined that the frequency-components of the selected sound-information are included in frequency-components contained in the current-frame of the digital-sound-signals, detecting the selected sound-information as monophonic-pitches-information and removing the frequency-components of the selected sound-information from the current-frame of the digital-sound-signals; and (f3_3) if it is determined that the frequency-components of the selected sound-information are not included in the frequency-components contained in the current-frame of the digital-sound-signals, adjusting the expected-performance-value.

20. The method of claim 12, wherein the step (a) comprises periodically updating the sound-information of different musical instruments.

21. The method of claim 12, wherein the step (a) comprises storing each individual pitch which can be expressed by the sound-information in the form of wave data when storing the sound-information of different musical instruments in the form of samples of sounds having at least one strength.

22. The method of claim 12, wherein the step (a) comprises storing each individual pitch which can be expressed by the sound-information in a form which can directly expressing the magnitudes of each frequency-components of the pitch when storing the sound-information of different musical instruments in the form of samples of sounds having at least one strength.

23. The method of claim 21 or 22, wherein the step (a) comprises separately storing sound-information of keyboard-instruments according to use/nonuse of pedals.

24. The method of claim 21 or 22, wherein the step (a) comprises separately storing sound-information of string-instruments by each string.

25. The method of claim 22, wherein the step (a) comprises performing Fourier transform on the sound-information of different musical instruments and storing the sound-information in a form in which the sound-information can be directly displayed.

26. The method of claim 22, wherein the step (a) comprises performing wavelet transform on the sound-information of different musical instruments and storing the sound-information in a form in which the sound-information can be directly displayed.

27. The method of claim 12, further comprising the step of (h) estimating performance accuracy based on the performance-error-information detected in step (f).

28. The method of claim 12, further comprising the step of (i) adding the individual notes of the performance-error-information to the existing score-information based on the performance-error-information detected in step (f).

29. The method of claim 12, wherein the step (b) comprises generating and storing at least one kind of information selected from the group consisting of pitch-information, note-length-information, speed-information, tempo-information, note-strength-information, detailed performance-information including staccato, staccatissimo, and pralltriller, and discrimination-information for performance using two-hands or performance using a plurality of instruments, based on the score to be performed.

* * * * *